United States Patent
Yamada

[11] Patent Number: 6,008,127
[45] Date of Patent: Dec. 28, 1999

[54] SEMICONDUCTOR DEVICE HAVING ETCHING STOPPER LAYER FORMED BY OXIDATION AND METHOD OF FABRICATING THE SAME

[75] Inventor: Masaki Yamada, Kanagawa-ken, Japan

[73] Assignee: Kabushiki Kaisha Toshiba, Japan

[21] Appl. No.: 08/965,887

[22] Filed: Nov. 7, 1997

[30] Foreign Application Priority Data

Nov. 11, 1996 [JP] Japan ..................................... 8-298338
May 16, 1997 [JP] Japan ..................................... 9-126134

[51] Int. Cl.$^6$ ..................................................... H01L 21/00
[52] U.S. Cl. ........................... 438/694; 438/695; 438/702; 257/644
[58] Field of Search ..................................... 438/689, 691, 438/692, 699, 700, 702, 714, 695, 694; 257/644

[56] References Cited

U.S. PATENT DOCUMENTS 5,233,135  8/1993  Chen et al. ............................... 174/262
5,285,103  2/1994  Chen et al. ............................... 257/644
5,336,638  8/1994  Suzuki et al. ............................ 437/190
5,552,341  9/1996  Lee .......................................... 437/192

Primary Examiner—Benjamin Utech
Assistant Examiner—Kin-Chan Chen
Attorney, Agent, or Firm—Finnegan, Henderson, Farabow, Garrett & Dunner, L.L.P.

[57] ABSTRACT

A process for fabricating a semiconductor device using an etching stopper film which does not increase the number of photo-etching steps and does not cause a deterioration in device characteristics comprises the steps of: forming an impurity region at the surface of a semiconductor substrate; forming a first insulating layer on the semiconductor substrate; forming a first hole in the first insulating layer and thereby exposing the impurity region; forming a first metal layer on the first insulating layer and the inner surface of the first hole; forming a second metal layer on the region of the first metal layer formed on the inner surface of the first hole and filling the first hole with the second metal layer; oxidizing the first metal layer with the second metal layer as a mask; forming a second insulating layer on the first metal layer and the second metal layer; forming a second hole in the second insulating layer exposing the second metal layer by etching the second insulating layer with the first metal layer and the second metal layer as etching stoppers; and filling the second hole with a metal and thereby forming a third metal layer.

39 Claims, 38 Drawing Sheets

SEMICONDUCTOR DEVICE HAVING ETCHING STOPPER LAYER FORMED BY OXIDATION AND METHOD OF FABRICATING THE SAME

BACKGROUND OF THE INVENTION

1. Field of the Invention

This invention relates to a method of fabricating a new semiconductor device using an etching stopper layer formed by oxidation, and to a new semiconductor device fabricated by this method.

2. Description of the Prior Art

As the micro-miniaturization of interconnection patterns of semiconductor integrated circuits progresses, increased difficulty of processing due to problems of positional misalignment in photolithography steps has been becoming marked. For example when an interlayer connection hole or an interconnector channel connecting to a contact electrode formed in an insulating film is formed by photo-etching, it sometimes happens that a necessary underlying film is unintentionally etched as a result of misalignment of a photomask and a semiconductor substrate. Also, when the shape of an interlayer connection hole or an interconnector channel is different from the shape of an underlying interlayer connection hole or interconnector channel it sometimes happens that a necessary underlying film is unintentionally etched by over-etching. Consequently, to carry out minute working it is essential to form on the underlying film an etching stopper film having an opening above the contact electrode, to protect the underlying film. Conventionally the etching stopper film has been formed on the underlying film by photo-etching each time a fine interlayer connection hole or interconnector channel is formed. In consideration of etching selectivity with respect to silicon oxide of interlayer insulating films, silicon nitride has been used for etching stopper films.

This kind of semiconductor device and its manufacturing method will now be described with reference to the sectional views of FIG. 1 through FIG. 6, taking as an example the case of a MOS type semiconductor device.

First, as shown in FIG. 1, a field oxide film 303 is formed on the surface of a semiconductor substrate 301, and on the semiconductor substrate 301 in a device formation region bounded by the field oxide film 303 are successively formed a gate insulating film 305, a polycrystalline silicon film 307 of a lower gate electrode, and an aluminum film 309 of an upper electrode. Then, a gate side wall insulating film 311 is formed on the side walls of the gate electrode by photo-etching. Also, high-concentration source and drain regions 313 and low-concentration source and drain regions 315 are formed in the semiconductor substrate 301 by ion implantation. Next, an interlayer insulating film 317 of for example boron phosphorus silicate glass (BPSG) or phosphorus silicate glass (PSG) is formed on the semiconductor substrate 301, the gate electrode 309 and the device separation region 303 by chemical vapor deposition (CVD) and the interlayer insulating film 317 is flattened by chemical mechanical polishing (CMP). Contact holes 319 are then formed above the source and drain regions 313 by photo-etching.

Next, as shown in FIG. 2, a barrier metal 321 consisting of titanium is formed on only the inner surfaces of the contact holes 319 by sputtering. An aluminum film to constitute interconnection metal is then deposited on the barrier metal 321 by sputtering, and contact electrodes 323 are formed completely filling the contact holes 319 with aluminum film using CVD or the like. Next, a silicon nitride film 351 having openings above the contact electrodes 323 is formed on the interlayer insulating film 317. The silicon nitride film 351 is formed by chemical dry etching. This state is shown in three-dimensional cross-section in FIG. 3. The silicon nitride film 351 has openings only over the contact electrodes 323.

Next, as shown in FIG. 4, a silicon oxide film 327 is formed as an interlayer insulating film on the silicon nitride film 351 and the contact electrodes 323 by for example CVD. Then, a photoresist film 329 having openings above the contact electrodes 323 is formed on the silicon oxide film 327.

Then, as shown in FIG. 5, with the photoresist film 329 as a mask, the interlayer insulating film 327 is etched using the silicon nitride film 351 and the contact electrodes 323 as etching stoppers to form interconnection channels 331. The photoresist film 329 is then removed. At this time, it sometimes happens that due to positional misalignment in the formation of the photoresist film 329 the positions of the openings in the photoresist film 329 and the contact electrodes 323 are misaligned. However, because the silicon nitride film 351 was formed on the interlayer insulating film 317, the silicon nitride film 351 serves as an etching stopper film at the time of formation of the interconnection channels 331 and prevents over-etching of the underlying interlayer insulating film 317. This state is shown in three-dimensional cross-section in FIG. 6.

An interconnection layer and a passivation film and so on are then formed to complete the semiconductor device.

Conventionally, when forming contact holes and via holes, an etching stopper film formed by photo-etching has been necessary to protect underlying films. In the method described above, at the time of formation of a connection hole such as a contact hole or a via hole, a nitride film is formed as an etching stopper film by photo-etching. However, as semiconductor devices become more highly integrated the number of steps of forming connection holes or interconnection channels or the like increases and it is necessary to form an etching stopper film by photo-etching for each of these steps, and the problem arises that the number of photo-etching steps increases as a result.

SUMMARY OF THE INVENTION

It is therefore an object of the present invention to form an etching stopper layer which does not increase the number of etching steps and does not cause a deterioration in device characteristics and manufacture a semiconductor device using this etching stopper layer.

To achieve this object and other objects, the invention provides a first process for fabricating a semiconductor device comprising the steps of: forming an impurity region at the surface of a semiconductor substrate; forming a first insulating layer on the semiconductor substrate; forming a first hole in the first insulating layer and thereby exposing the impurity region; forming a first metal layer on the first insulating layer and the inner surface of the first hole; forming a second metal layer on the region of the first metal layer formed on the inner surface of the first hole and filling the first hole with the second metal layer; oxidizing the first metal layer with the second metal layer as a mask; forming a second insulating layer on the first metal layer and the second metal layer; forming a second hole in the second insulating layer exposing the second metal layer by etching the second insulating layer with the first metal layer and the second metal layer as etching stoppers; and filling the second hole with a metal and thereby forming a third metal layer.

With this first process, because a first region of the first metal layer (the region formed on the first insulating layer) can be used as an etching stopper, it is possible to reduce the number of steps of forming etching stoppers by photo-etching.

To achieve the above-mentioned object and other objects the invention also provides a second process for fabricating a semiconductor device comprising the steps of: forming a conducting layer on a semiconductor substrate; forming a first insulating layer on the conducting layer; forming a first hole in the first insulating layer and thereby exposing the conducting layer; forming a first metal layer on the first insulating layer and the inner surface of the first hole; forming a second metal layer on the region of the first metal layer formed on the inner surface of the first hole and thereby filling the first hole; oxidizing the first metal layer with the second metal layer as a mask; forming a second insulating layer on the first metal layer and the second metal layer; forming a second hole in the second insulating layer exposing the second metal layer by etching the second insulating layer with the first metal layer and the second metal layer as etching stoppers; and filling the second hole with a metal and thereby forming a third metal layer.

With this second process also, because a first region of the first metal layer (the region formed on the first insulating layer) can be used as an etching stopper, it is possible to reduce the number of steps of forming etching stoppers by photo-etching. Furthermore, the first region of the first metal layer can be used as an etching stopper of when the dual-damascene method is used.

To achieve the above-mentioned object and other objects the invention also provides a third process, for fabricating a semiconductor device having a contact plug connecting a first conducting layer to a second conducting layer disposed thereabove with an interlayer insulating layer disposed therebetween, comprising the steps of: forming a first conducting layer on a semiconductor substrate; forming a first insulating layer on this first conducting layer; forming a first hole in the first insulating layer and thereby exposing the first conducting layer; forming a first metal layer on the first insulating layer and the inner surface of the first hole; forming a second metal layer on the region of the first metal layer formed on the inner surface of the first hole and thereby filling the first hole; oxidizing the first metal layer with the second metal layer as a mask; forming a second insulating layer on the first metal layer and the second metal layer; forming a second hole in the second insulating layer exposing the second metal layer by etching the second insulating layer with the first metal layer and the second metal layer as etching stoppers; and filling the second hole with a metal and thereby forming a second conducting layer.

With this third process also, because a first region of the first metal layer (the region formed on the first insulating layer) can be used as an etching stopper, it is possible to reduce the number of steps of forming etching stoppers by photo-etching.

Other objects, features and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily obtained by reference to the following detailed description considered in connection with the accompanying drawings, in which.

DETAILED DESCRIPTION OF THE PREFERRED EMBODIMENTS

As the microminiaturization of interconnection patterns of semiconductor integrated circuits progresses, increased difficulty of processing due to problems of position misalignment in photolithography steps has been becoming marked. For example when an interlayer connection hole or an interconnector channel connecting to a contact electrode formed in an insulating film is formed by photo-etching, it sometimes happens that a necessary underlying film is unintentionally etched as a result of misalignment of a photomask and a semiconductor substrate. Also, when the shape of an interlayer connection hole or an interconnector channel is different from the shape of an underlying interlayer connection hole or interconnector channel it sometimes happens that a necessary underlying film is unintentionally etched by over-etching. Consequently, to carry out minute working it is essential to form on the underlying film an etching stopper film having an opening above the contact electrode, to protect the underlying film. Preferred embodiments of the invention in which a new etching stopper provided by the invention is used will now be described with reference to the accompanying drawings.

FIG. 7 through FIG. 16 are sectional views illustrating in sequence a first preferred embodiment of a process for fabricating a semiconductor device according to the invention, taking as an example a MOS type semiconductor device.

Figure 1:
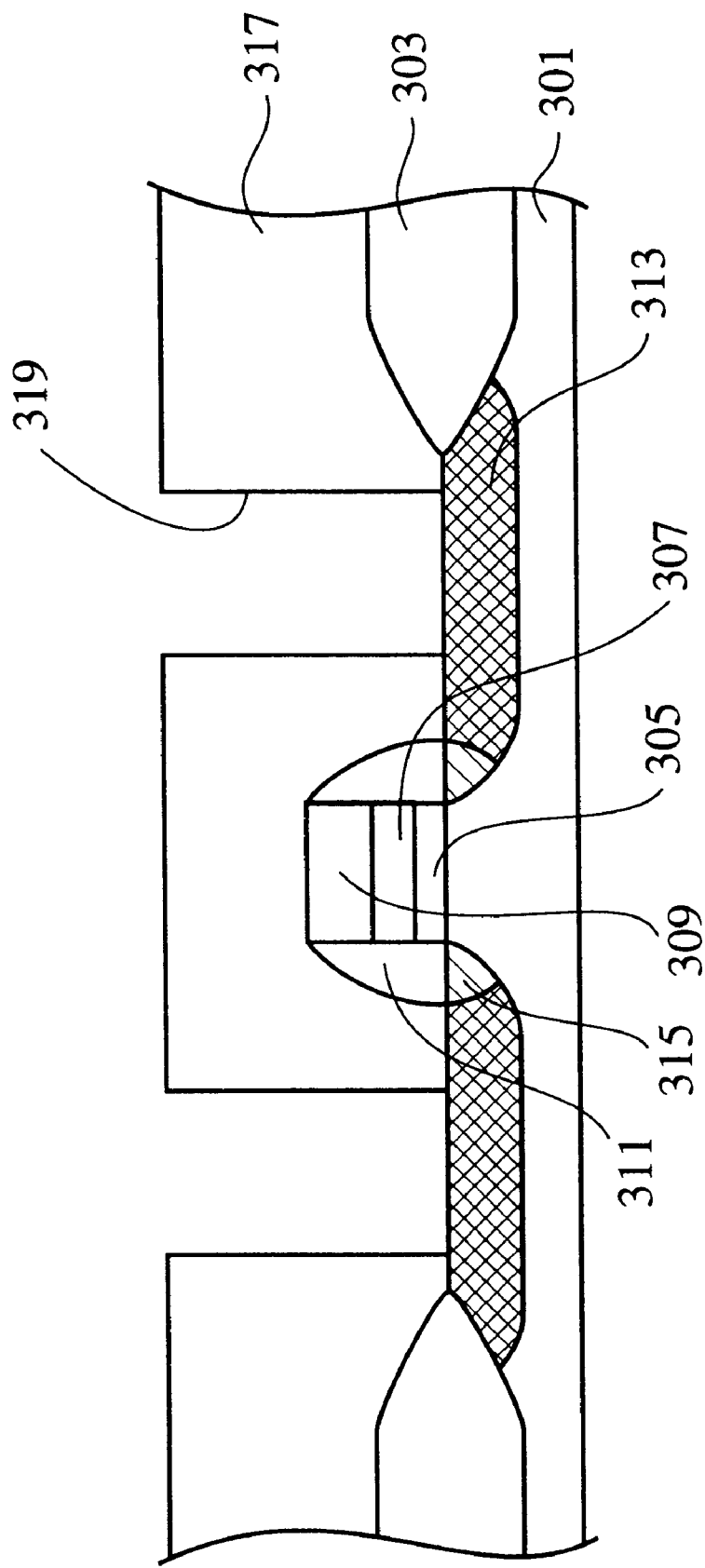
FIG. 1 through FIG. 6 are sectional views illustrating in sequence a conventional process for fabricating a semiconductor device.
Figure 2:
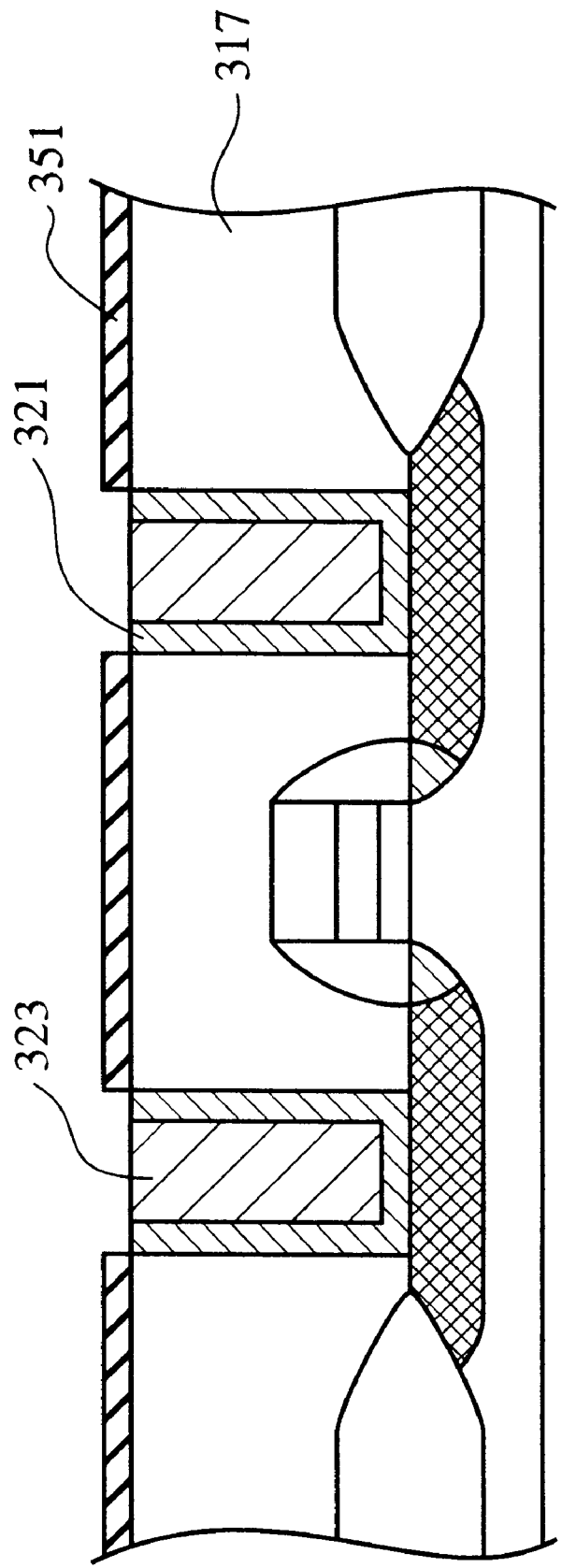
Figure 3:
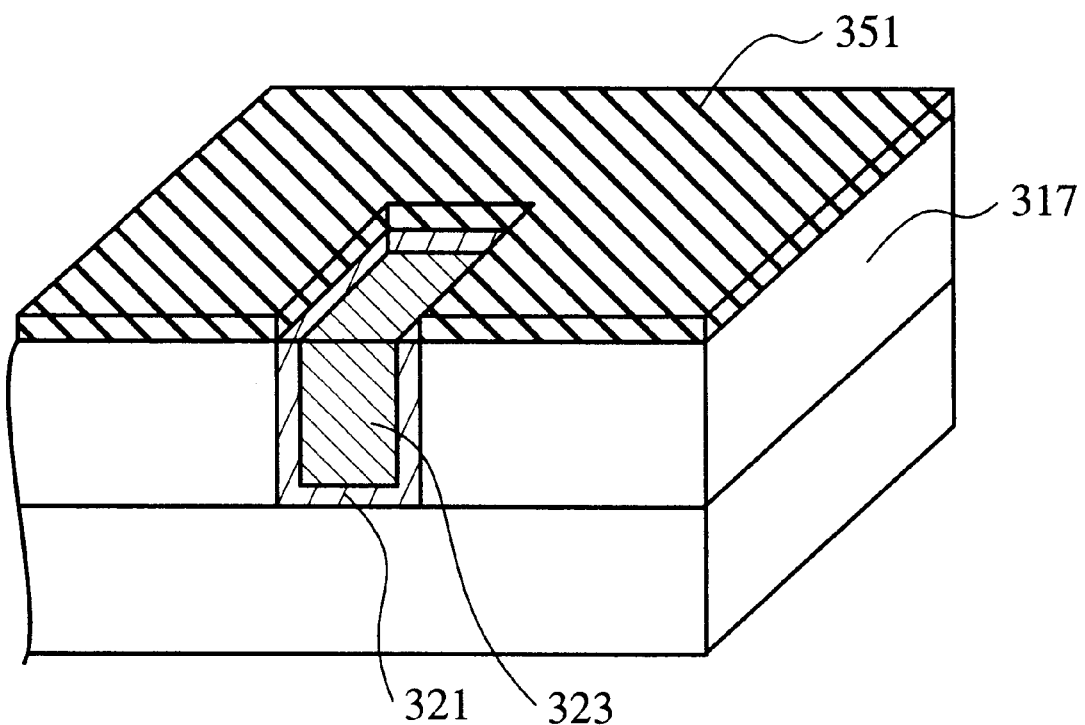
Figure 4:
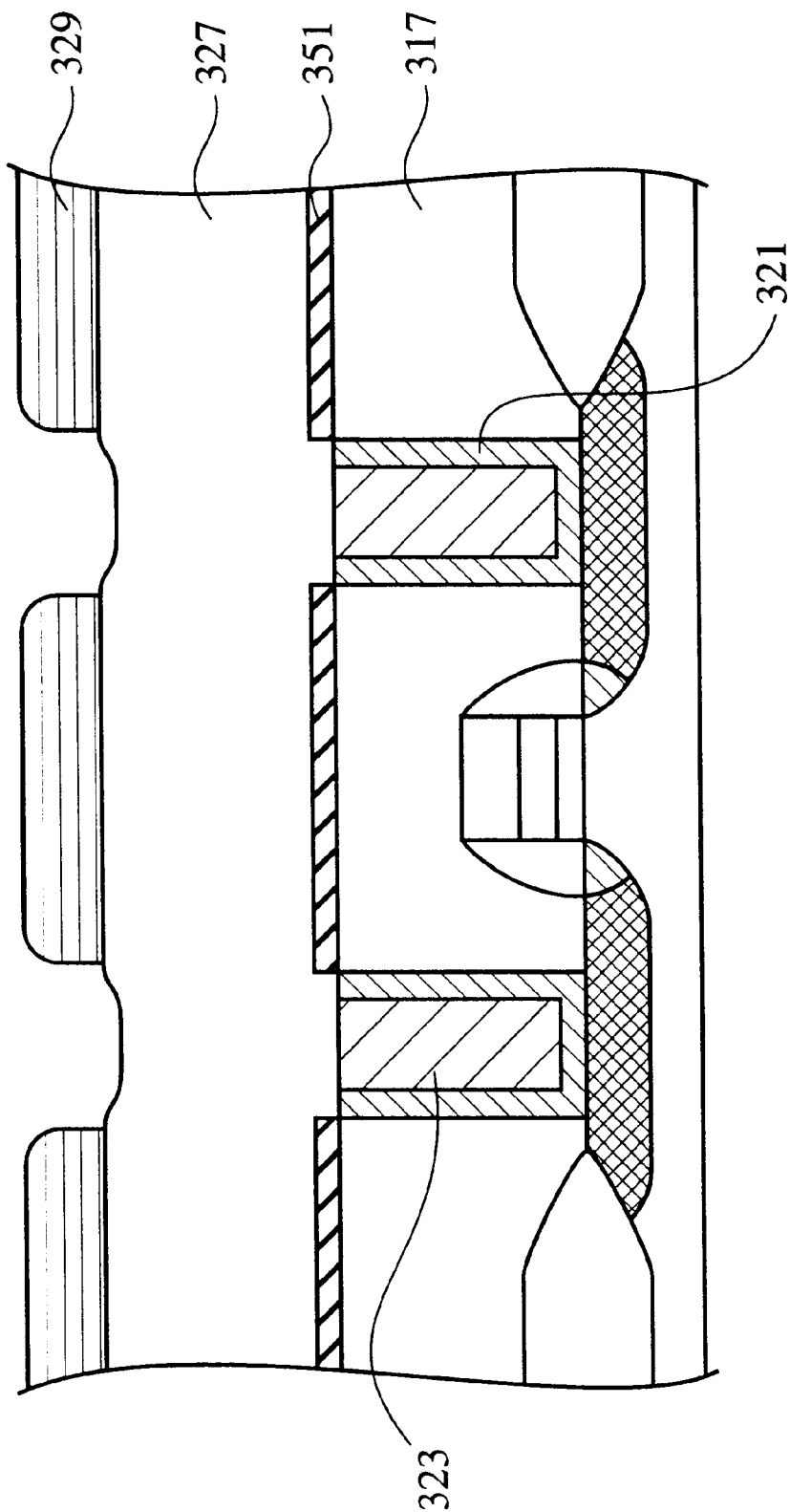
Figure 5:
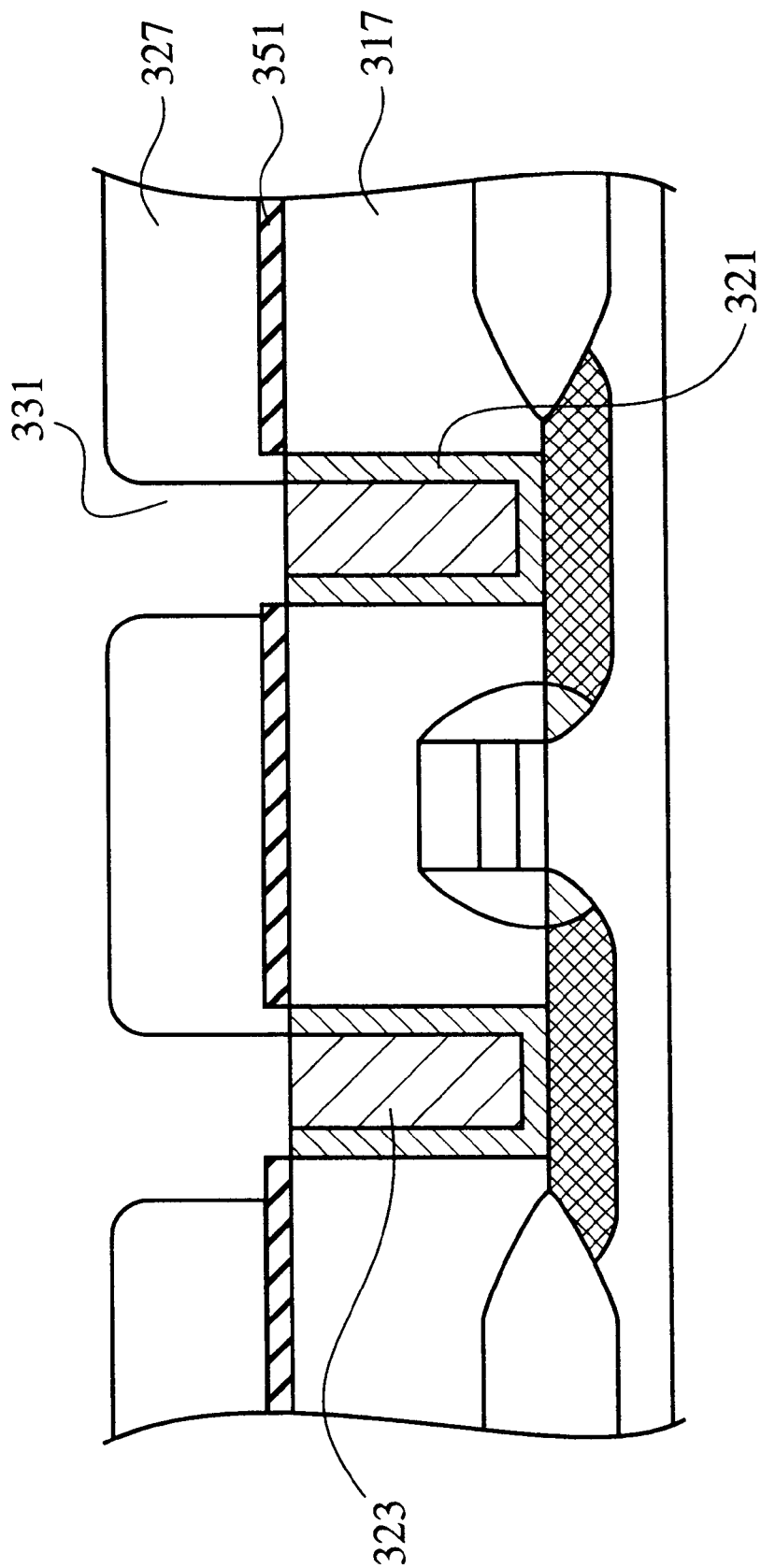
Figure 6:
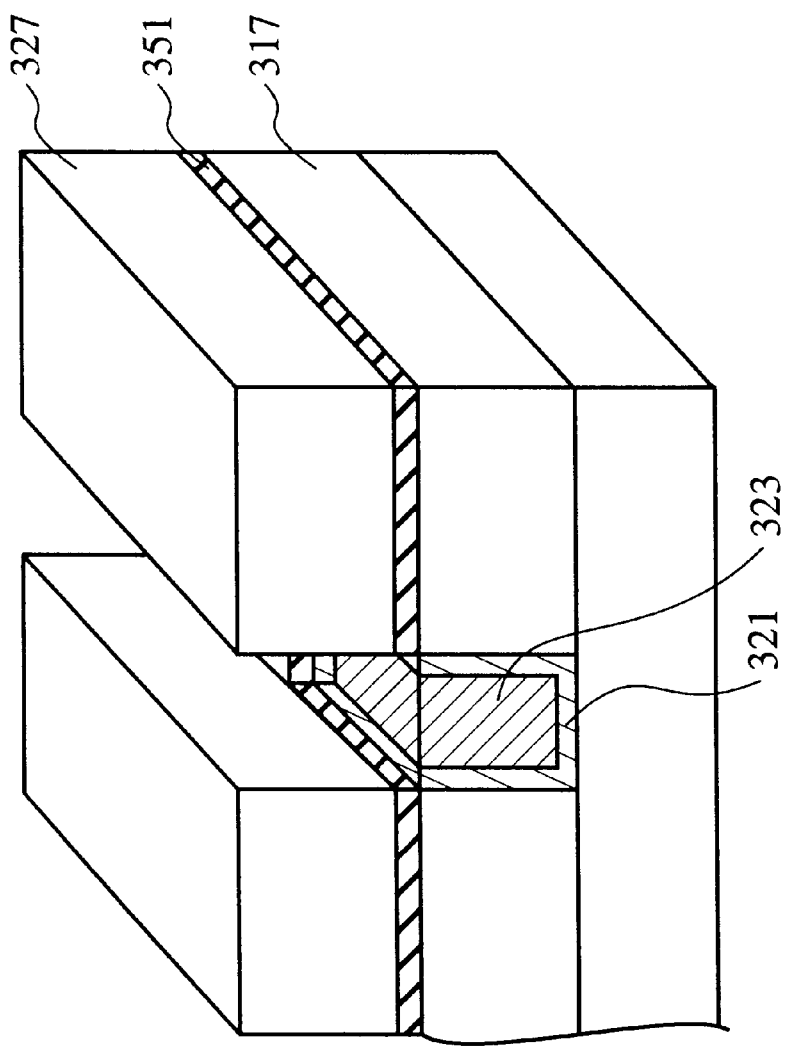
Figure 7:
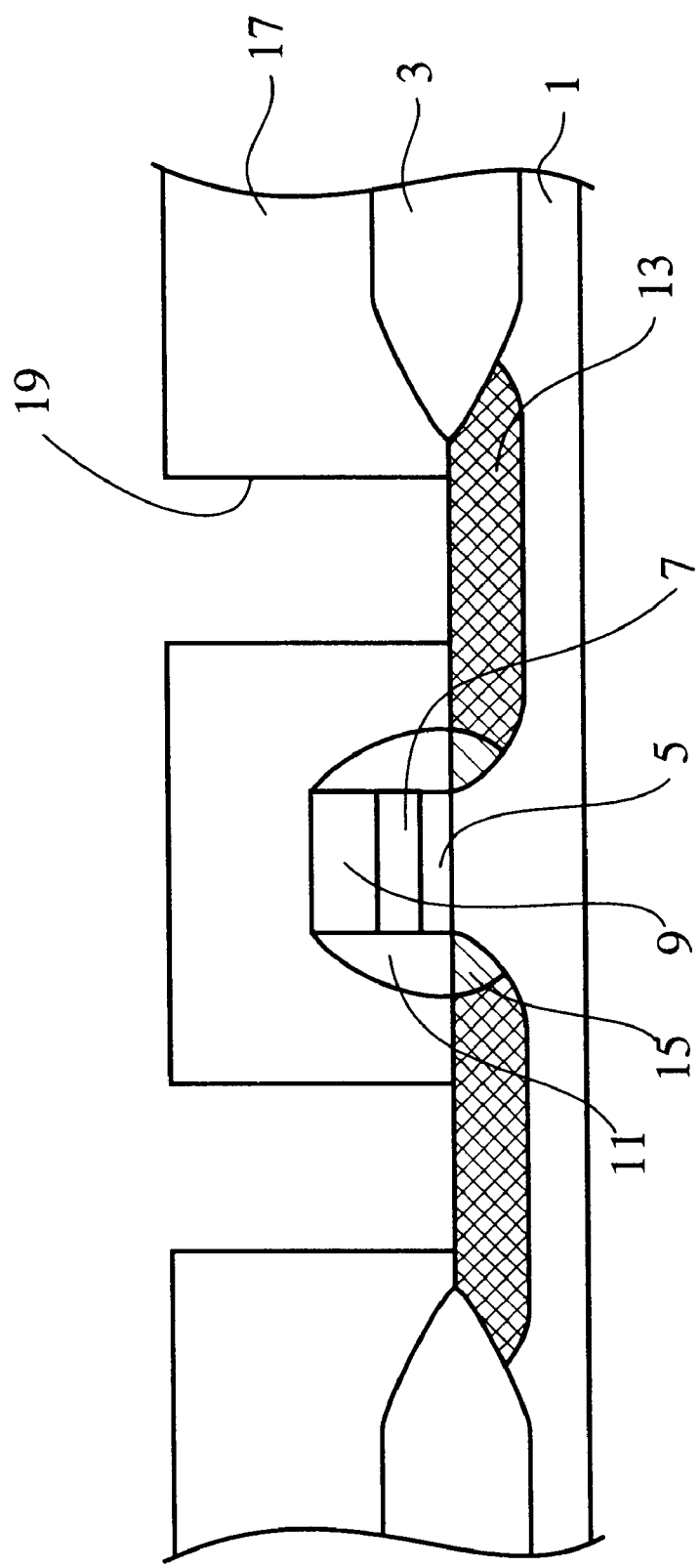
FIG. 7 through FIG. 16 are sectional views illustrating in sequence a process for fabricating a semiconductor device of a first preferred embodiment of the invention.

First, as shown in FIG. 7, a field oxide film 3 is formed on the surface of a semiconductor substrate 1, and on the semiconductor substrate 1 in a device formation region bounded by the field oxide film 3 are successively formed and a gate insulating film 5, a polycrystalline silicon film 7 of a lower gate electrode and an aluminum film 9 of an upper electrode. A gate side wall insulating film 11 is then formed on the side walls of the gate electrode by photo-etching. Also, high-concentration source and drain regions 13 and low-concentration source and drain regions 15 are formed in the semiconductor substrate 1 by ion implantation. Next, an interlayer insulating film 17 of for example boron phosphorus silicate glass (BPSG) or phosphorus silicate glass (PSG) is formed on the semiconductor substrate 1, the gate electrode 9 and the device separation region 3 by chemical vapor deposition (CVD) and the interlayer insulating film 17 is flattened by chemical mechanical polishing (CMP). Contact holes 19 are then formed above the high-concentration source and drain regions 13 by photo-etching.

Figure 8:
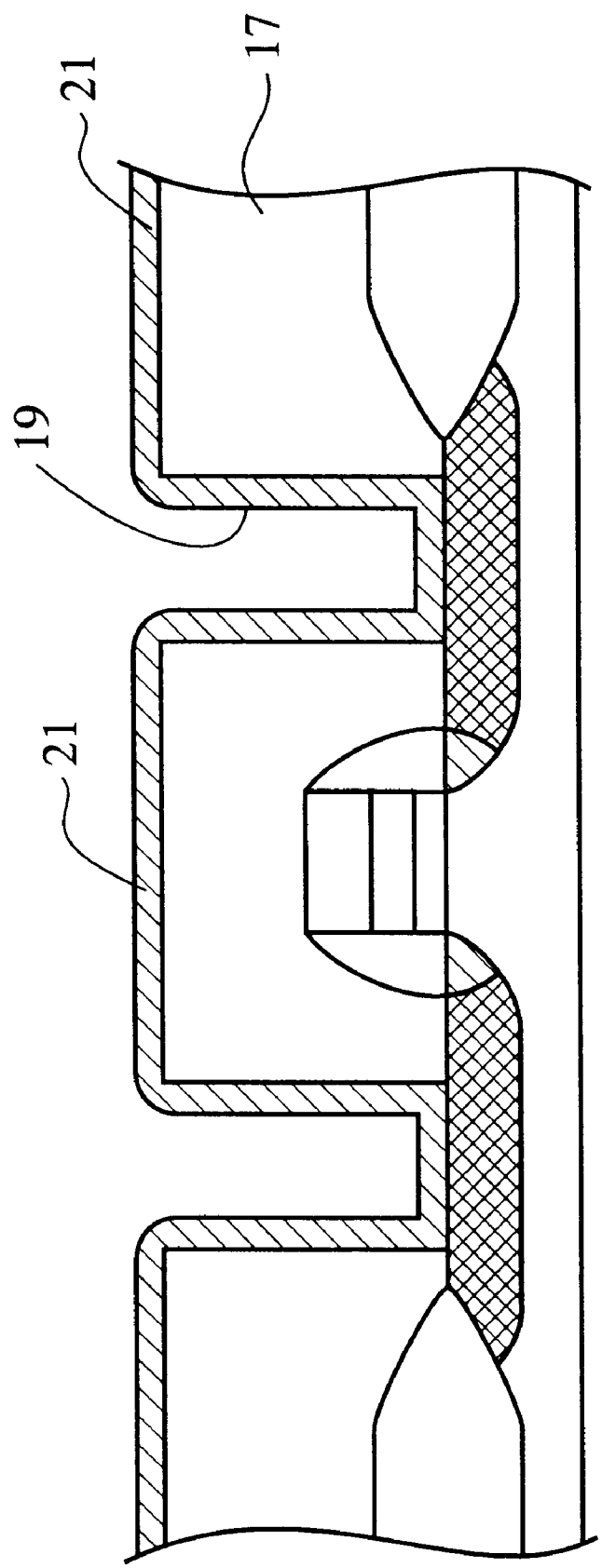

Next, as shown in FIG. 8, a barrier metal 21 consisting of tantalum is formed on the interlayer insulating film 17 and the inner surfaces of the contact holes 19 by sputtering.

Figure 9:
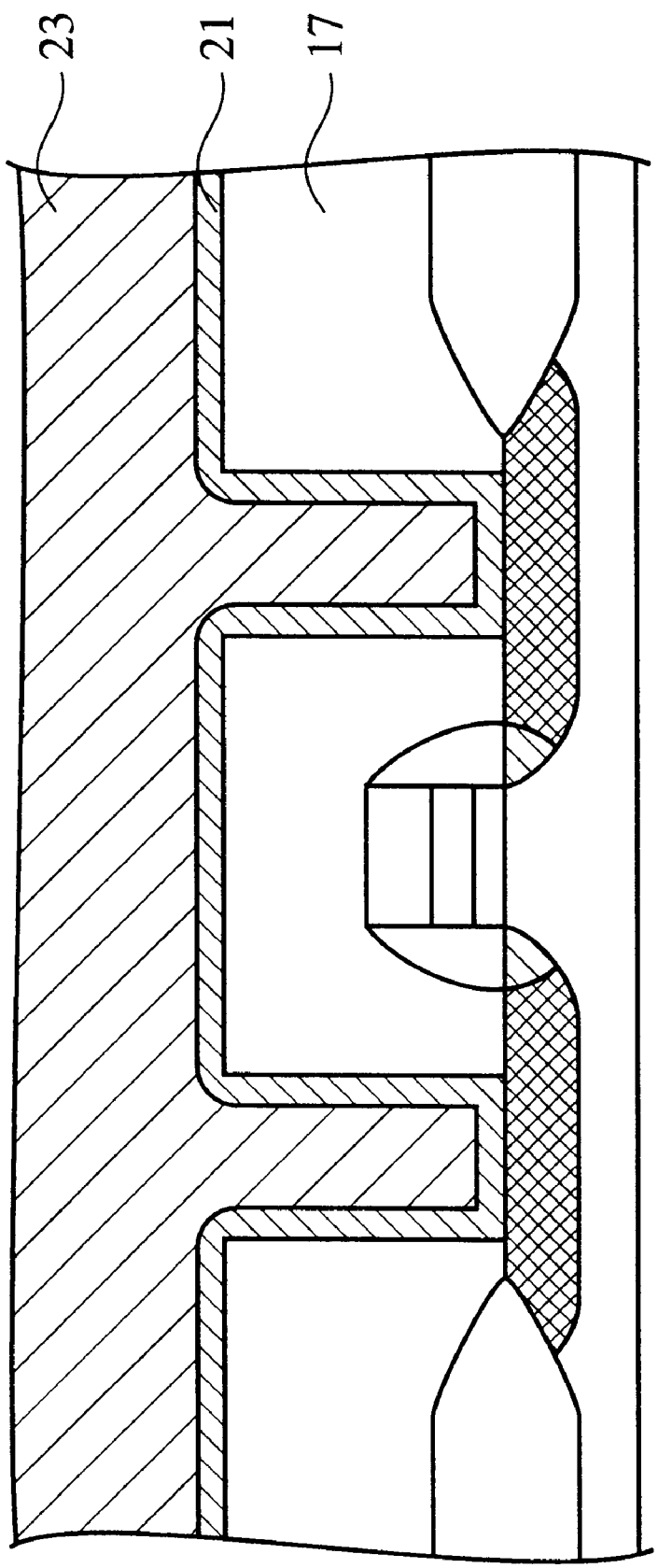

Then, as shown in FIG. 9, an aluminum film 23 to constitute interconnection metal is formed on the barrier metal 21 by CVD or the like so that the insides of the contact holes 19 are completely filled.

Figure 10:
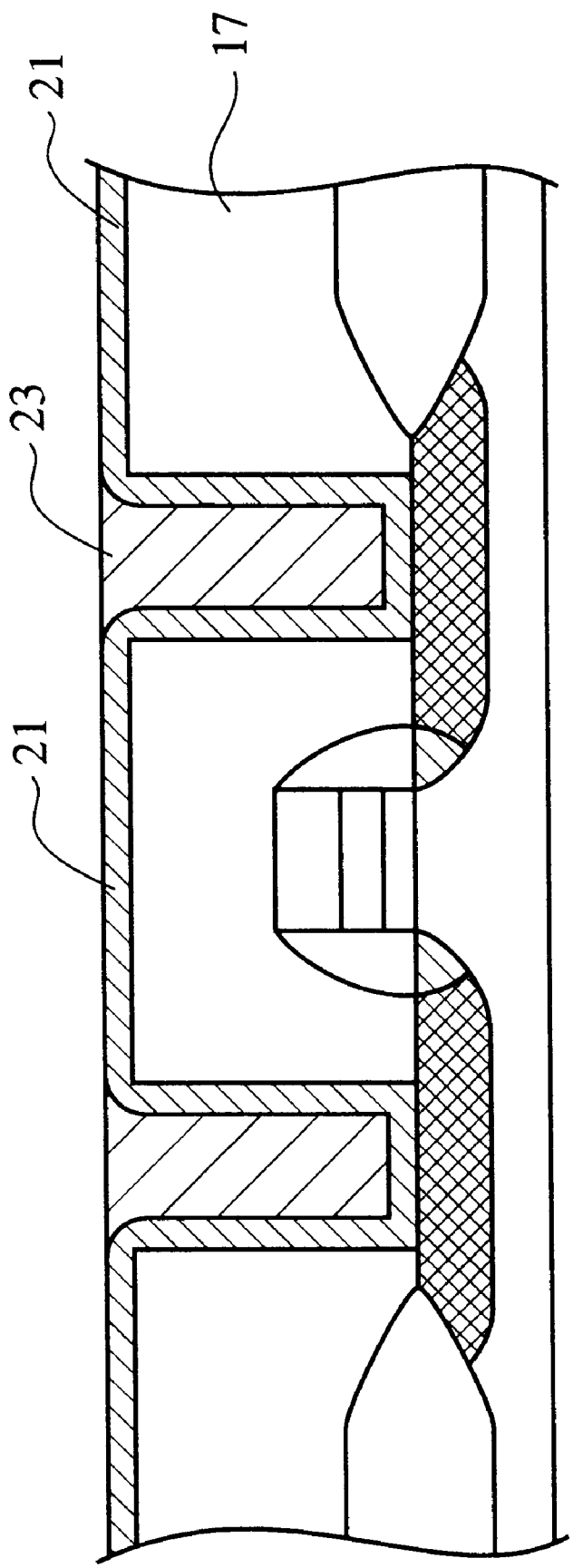
Figure 11:
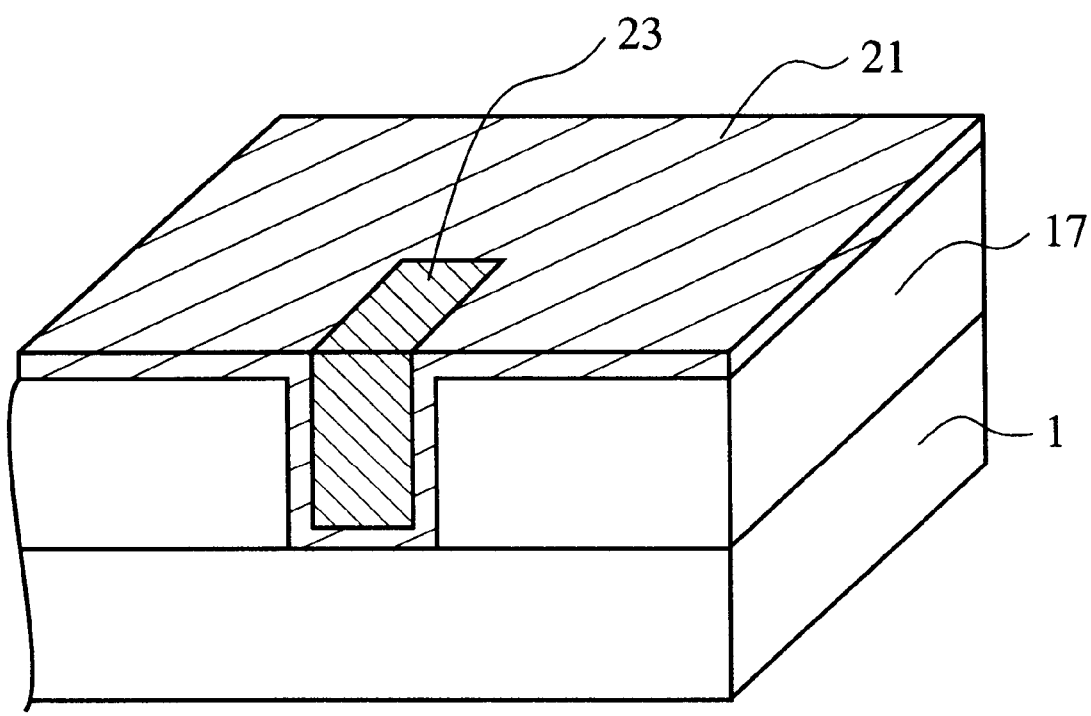

Then, as shown in FIG. 10, the aluminum film 23 is flattened by CMP to form contact electrodes 23. At this time, by a suitable solvent (for example a slurry containing alumina) being selected, the tantalum film used as the barrier metal 21 is made to serve as an etching stopper film. The etching is terminated when the barrier metal 21 on the interlayer insulating film 17 becomes exposed. This state is shown in three-dimensional cross-section in FIG. 11. As seen from above the structure is that of a tantalum film 21 having openings above the contact electrodes 23 formed on an insulating film 17.

Figure 12:
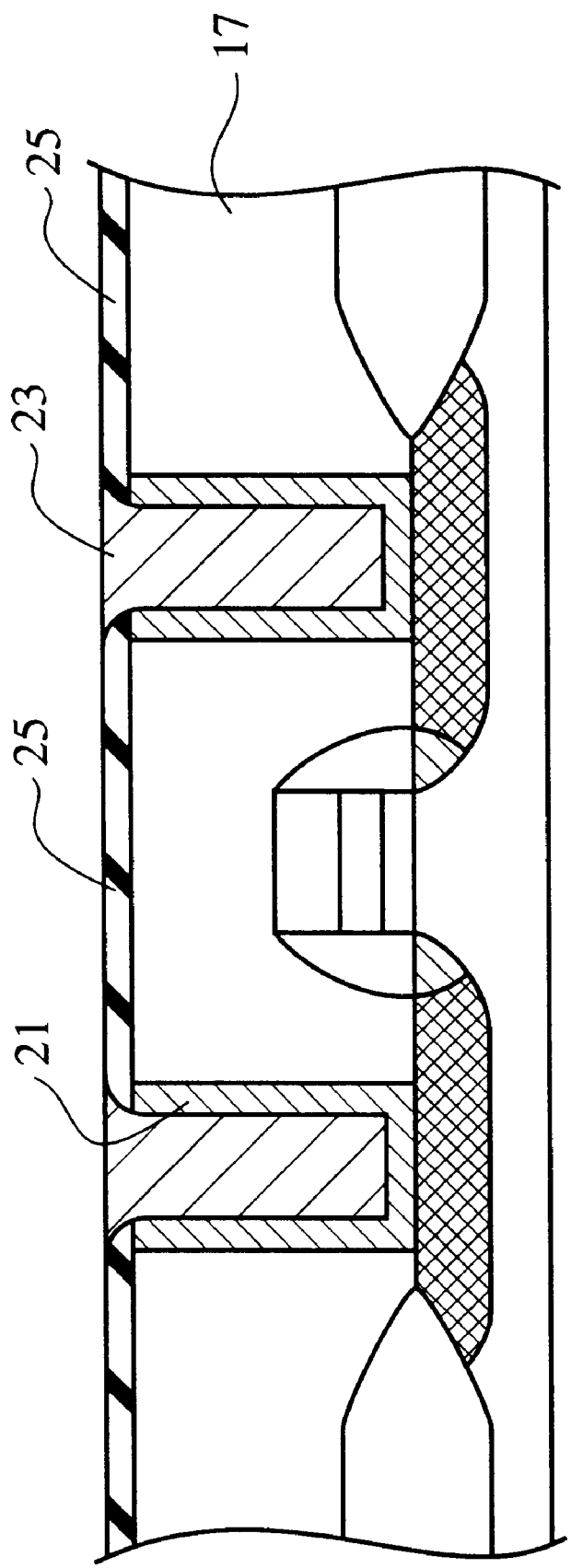
Figure 13:
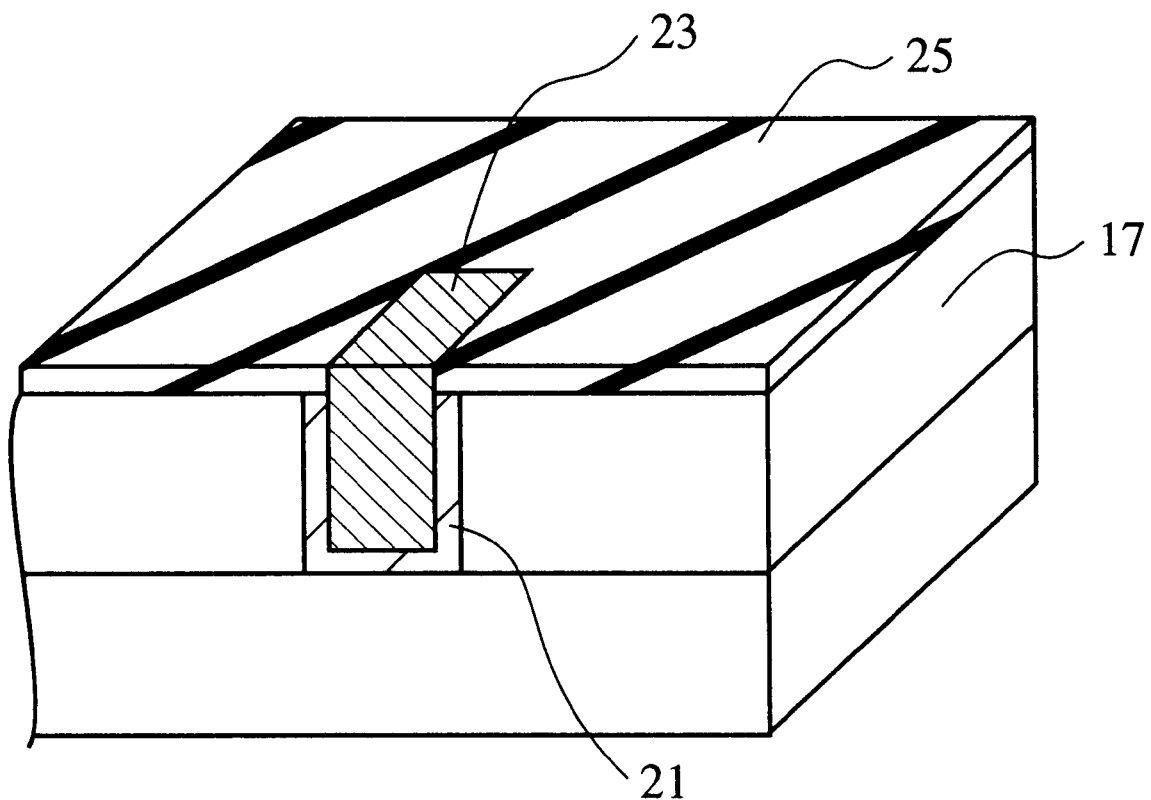

Next, as shown in FIG. 12, the tantalum film on the interlayer insulating film 17 is oxidized with the aluminum film 23 as a mask and thereby transformed into an insulating tantalum oxide film 25. At this time, it is necessary to oxidize only the tantalum film constituting the barrier metal 21, without oxidizing the aluminum of the contact electrode 23. As the oxidation method, for example by carrying out oxidation in a hydrogen atmosphere containing steam (besides dilution oxidation, oxidation by radical oxidation or anodic oxidation are also possible) it is possible to form the tantalum oxide film 25 without oxidizing the aluminum film constituting the contact electrodes 23. This is because in the case of aluminum in an oxidizing atmosphere the aluminum surface becomes covered with aluminum oxide (alumina) and oxidation does not progress inward. This state is shown in three-dimensional crosssection in FIG. 13. As seen from above the structure is that of a tantalum oxide film 21 having openings above the contact electrodes 23 formed on the an insulating film 17.

Figure 14:
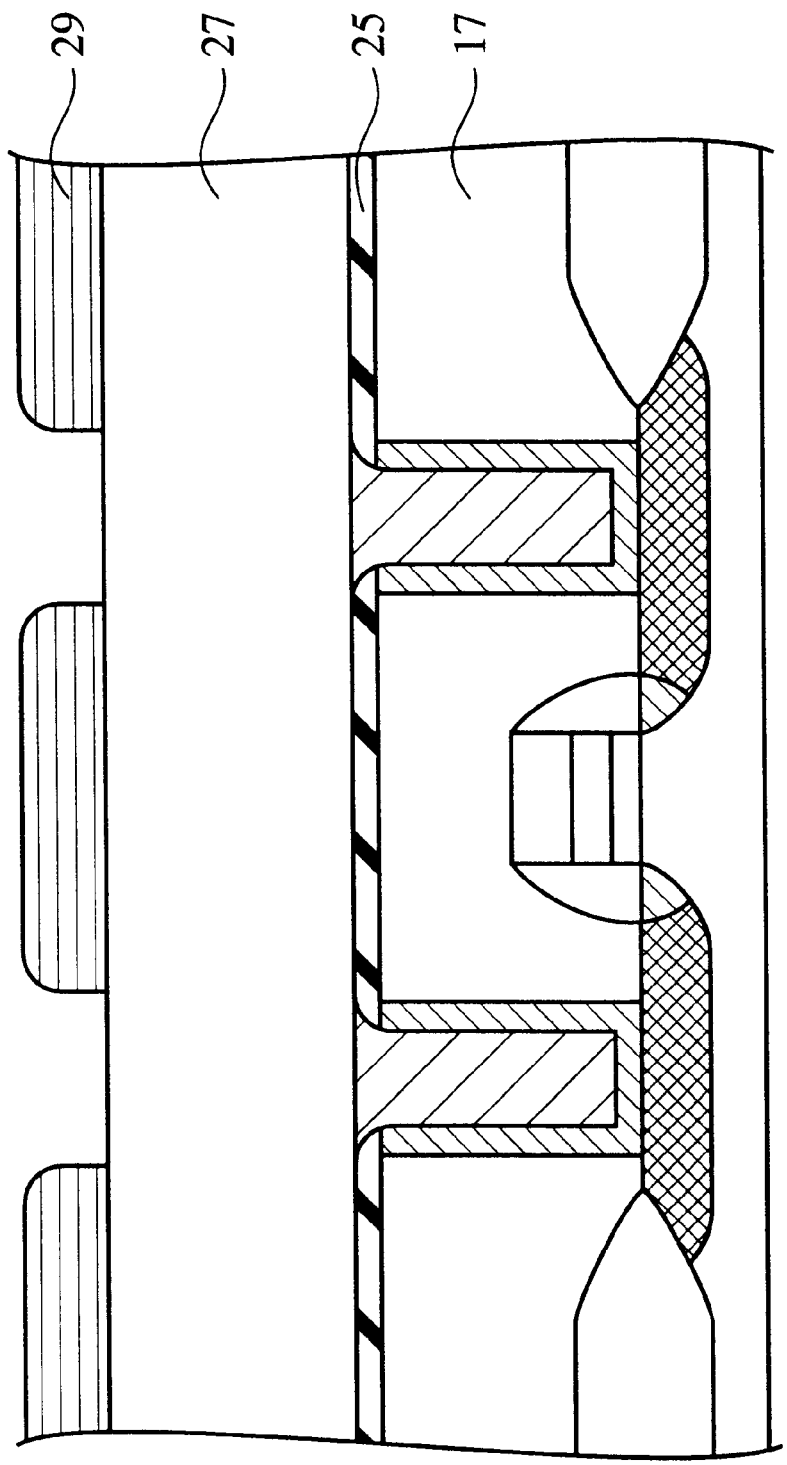

Next, as shown in FIG. 14, a silicon oxide film 27 is formed on the tantalum oxide film 25 and the contact electrodes 23 as an interlayer insulating film 27. Then, a photoresist film 29 having openings over the contact electrodes 23 is formed on the silicon oxide film 27.

Figure 15:
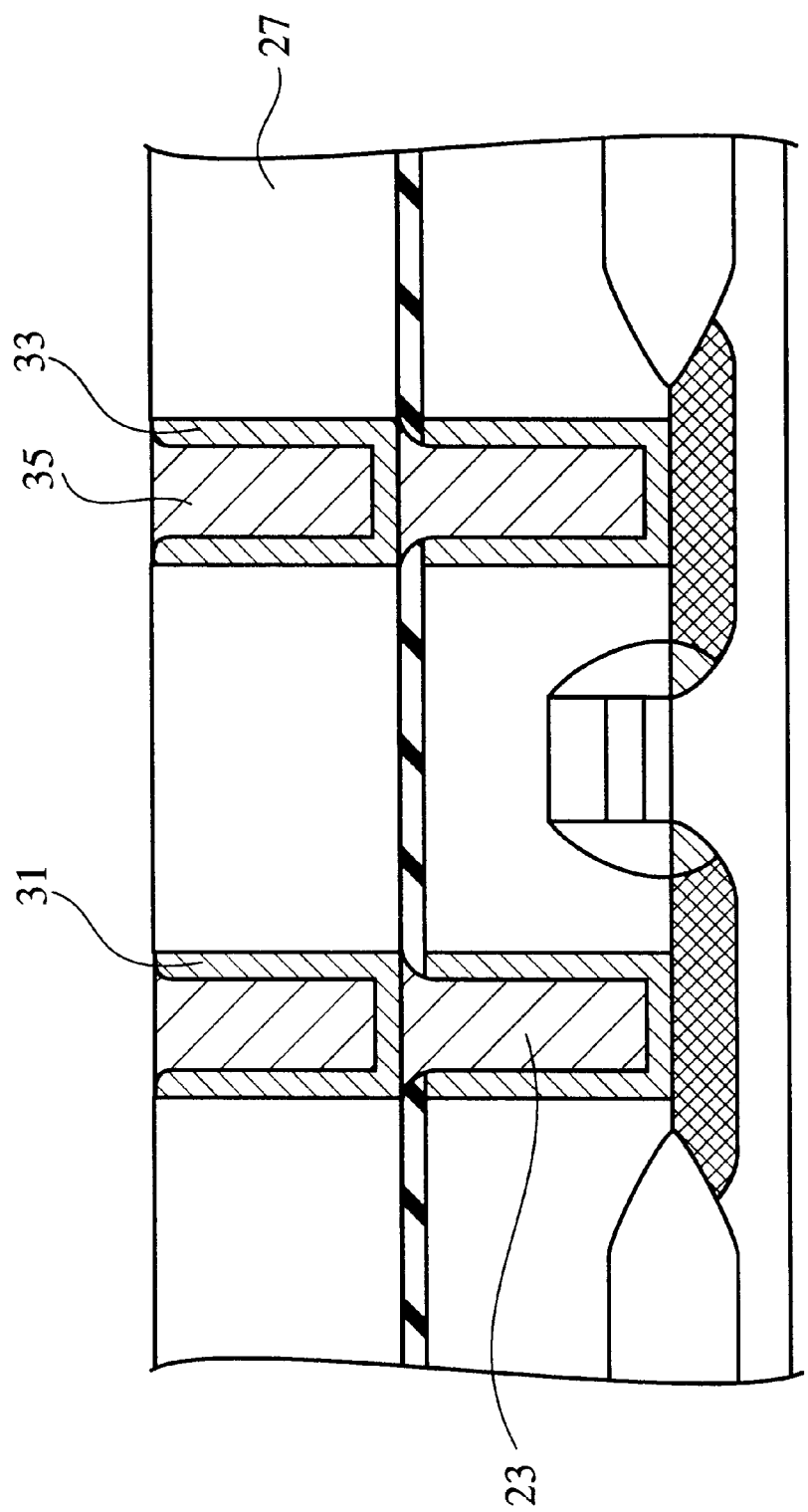
Figure 16:
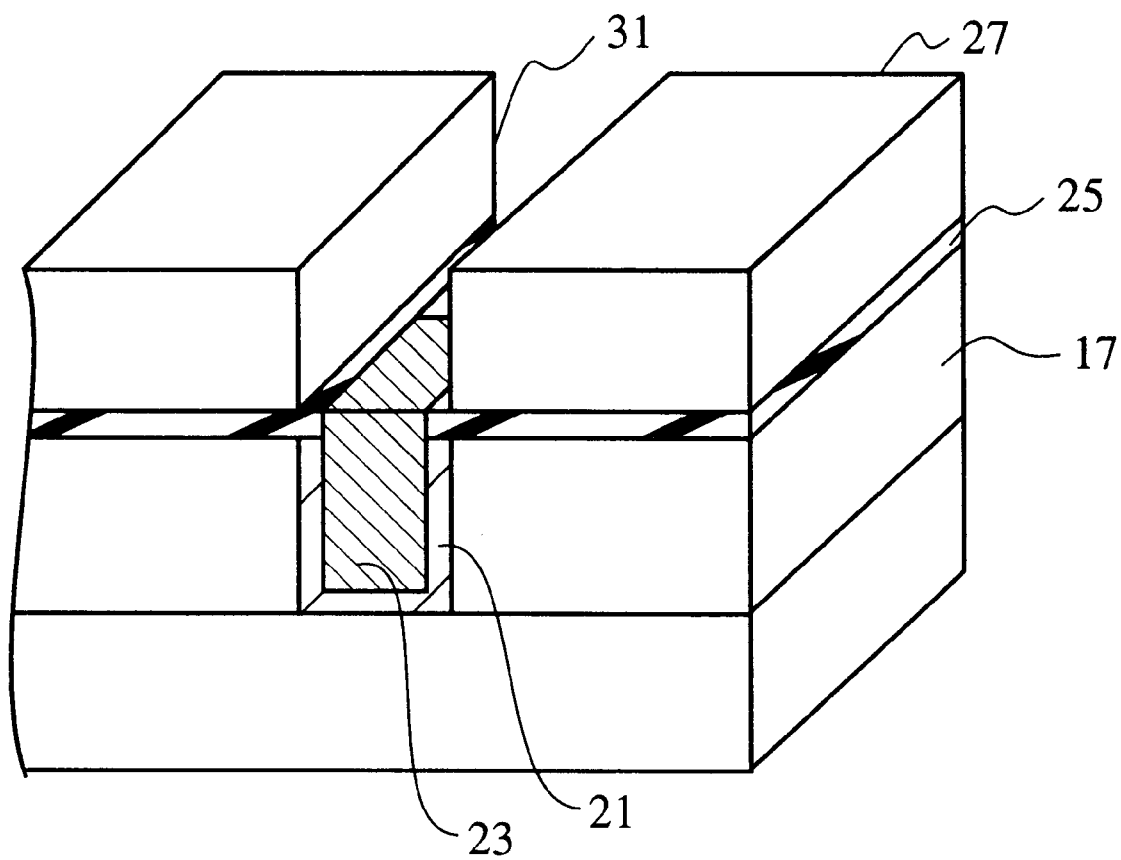

Then, as shown in FIG. 15, with the photoresist film 29 as a mask, the interlayer insulating film 27 is etched to expose the contact electrodes 23 and via holes 31 connecting with the aluminum film 23 are thereby formed. At this time, even if at the time of formation of the photoresist film 29 the positions of the openings in the photoresist film 29 and the contact electrodes 23 were misaligned, because the tantalum oxide film 25 serves as an etching stopper film, the interlayer insulating film 17 is not etched together with the interlayer insulating film 27. This is because if the etching selection ratio is suitably selected, tantalum oxide constitutes an etching stopper film with respect to silicon dioxide. This state is shown in three-dimensional cross-section in FIG. 16.

Then a barrier metal 33 and an aluminum film 35 are deposited in the via holes 31. An interconnection layer and a passivation film and so on are then formed to complete the semiconductor device. In an alternative to the first embodiment different metals may be used. For example the barrier metal 21 niobium, and the contact electrodes 23 may be copper. Copper has the advantage of low resistivity.

FIG. 17 through FIG. 24 are sectional views illustrating in sequence a second preferred embodiment of the invention, again using the example of a MOS type semiconductor device. In this second preferred embodiment, the dual-damascene method is used as the interconnection formation method. In the dual 10 damascene method, wiring is formed by burying a conductor in grooves formed in insulating films.

Figure 17:
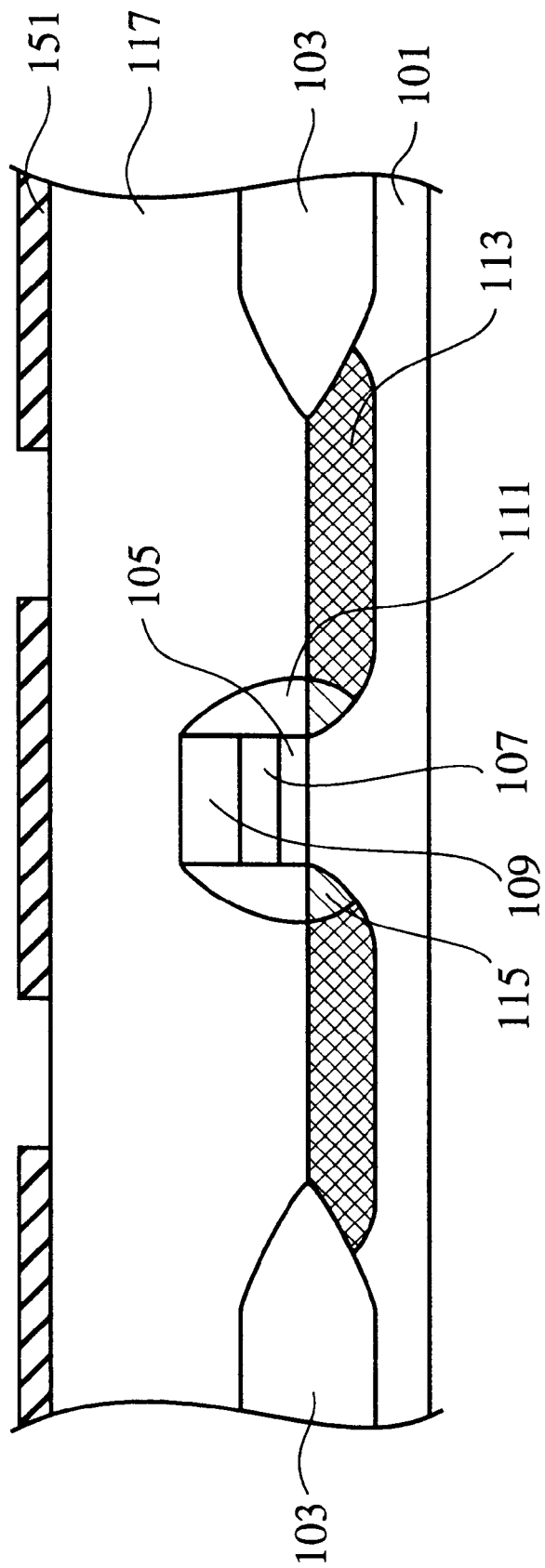
FIG. 17 through FIG. 24 are sectional views illustrating in sequence a process for fabricating a semiconductor device of a second preferred embodiment of the invention.

First, as shown in FIG. 17, a field oxide film 103 is formed on the surface of a semiconductor substrate 101, and on the semiconductor substrate 101 in a device formation region bounded by the field oxide film 103 are successively formed a gate insulating film 105, a polycrystalline silicon film 107 of a lower gate electrode and an aluminum film 109 of an upper electrode. Then, a gate side wall insulating film 111 is formed on the side walls of the gate electrode by photo-etching. Also, high-concentration source and drain regions 113 and low-concentration source and drain regions 115 are formed in the semiconductor substrate 101 by ion implantation. Next, an interlayer insulating film 117 of for example boron phosphorus silicate glass (BPSG) or phosphorus silicate glass (PSG) is formed on the semiconductor substrate 101, the gate electrode 109 and the device separation region 103 by chemical vapor deposition (CVD), and the interlayer insulating film 117 is flattened by chemical mechanical polishing (CMP). Then, a silicon nitride film 151 having openings above the high-concentration source and drain diffusion layer regions is formed on the interlayer insulating film 117 by photo-etching.

Figure 18:
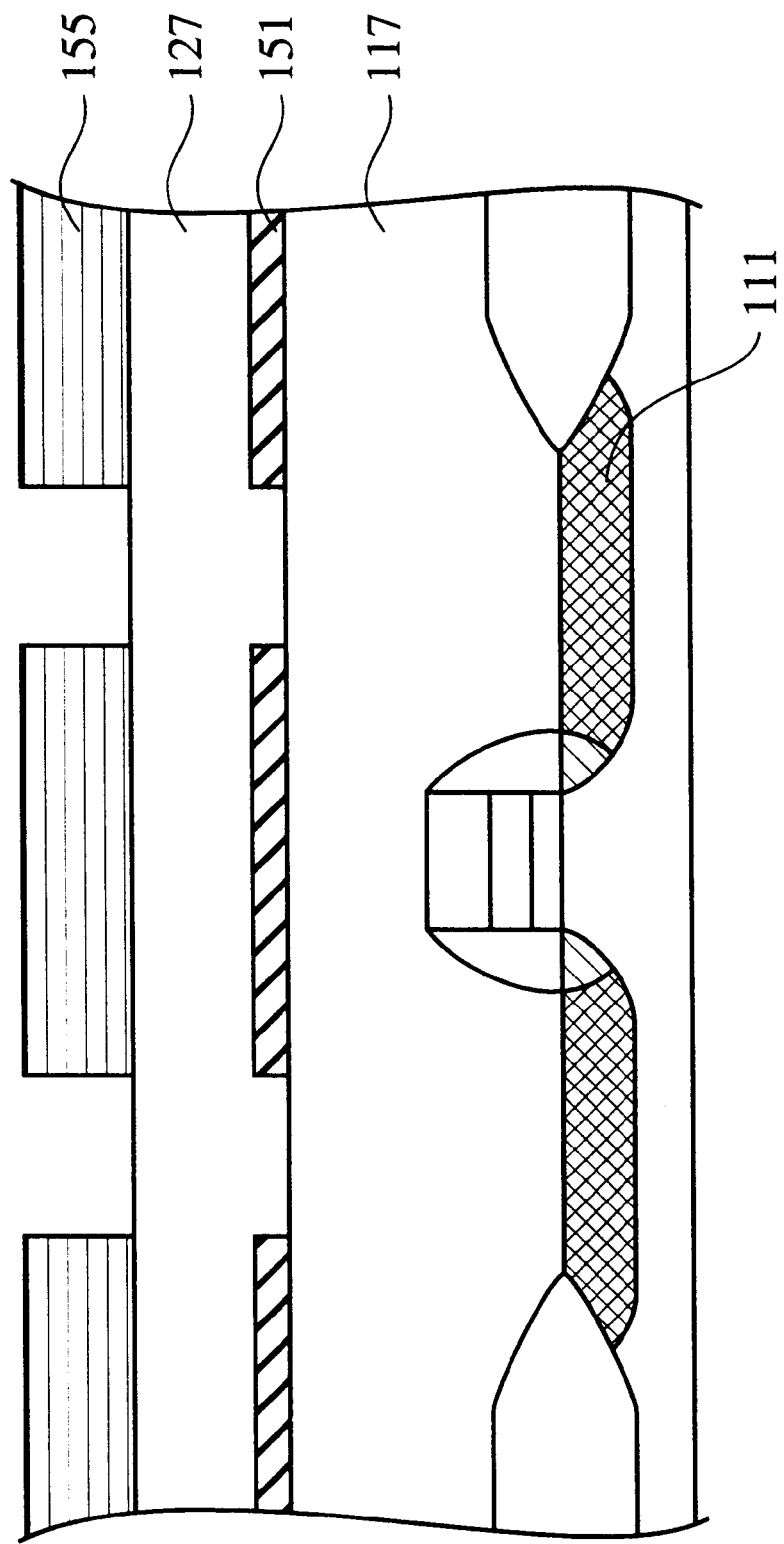

Next, as shown in FIG. 18, an interlayer insulating film 127 is formed on the interlayer insulating film 117 and the silicon nitride film 151 by chemical vapor deposition (CVD), and the interlayer insulating film 127 is then flattened by chemical mechanical polishing (CMP). A photoresist film 155 having openings above regions where contact holes connecting with the high-concentration source and drain diffusion regions are to be formed is formed on the interlayer insulating film 127 by photo-etching.

Figure 19:
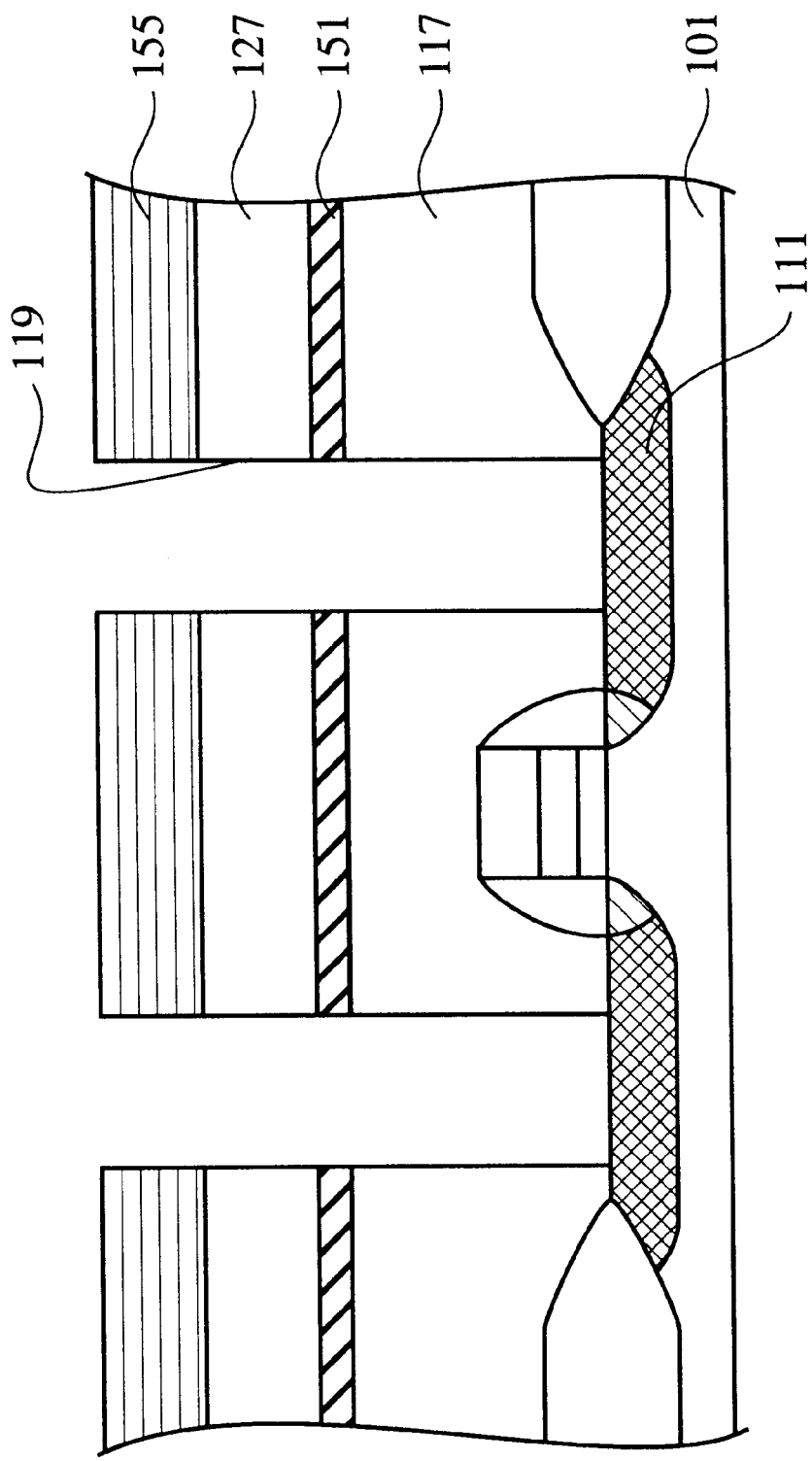

Next, as shown in FIG. 19, with the photoresist film 155 as a mask, the interlayer insulating films 127 and 117 are etched to form interconnection channels 119 reaching the high-concentration source and drain diffusion regions. The interconnection channels 119 include contact holes connecting with the high-concentration source and drain diffusion layers 113. At this time, even if there is a positional misalignment between the openings in the photoresist film 155 and the regions where the contact holes are to be formed, because the silicon nitride film 151 serves as an etching stopper film, over-etching of the interlayer insulating film 117 is prevented.

Figure 20:
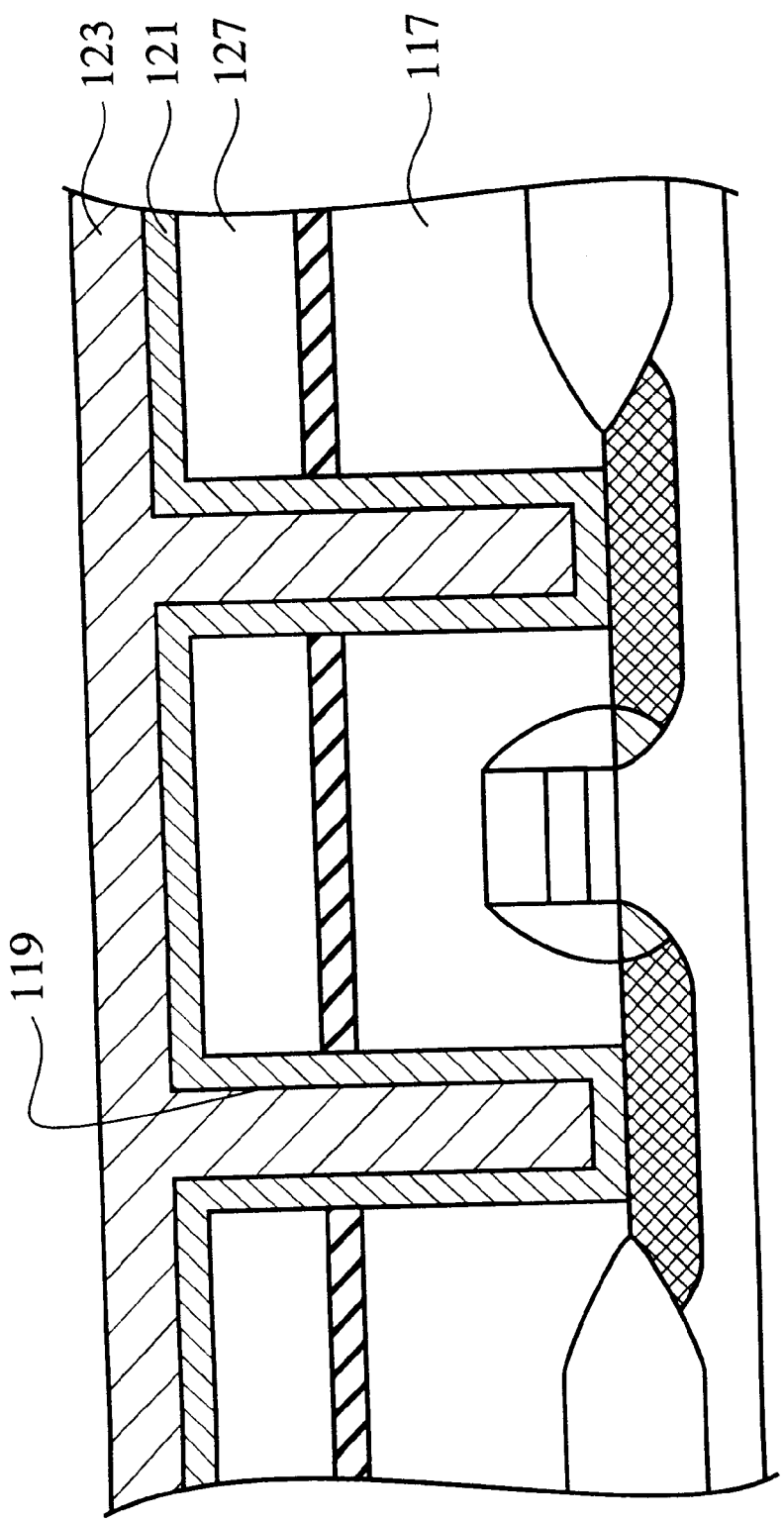

Next, as shown in FIG. 20, the photoresist film 155 is removed and a tantalum film 121 is formed as a barrier metal on the inner surfaces of the interconnection channels 119 and on the interlayer insulating film 127 by sputtering. Then, an aluminum film 123 is formed in the interconnection channels 119 and on the tantalum film 121 by CVD so that the interconnection channels 119 are completely filled by the aluminum film 123.

Figure 21:
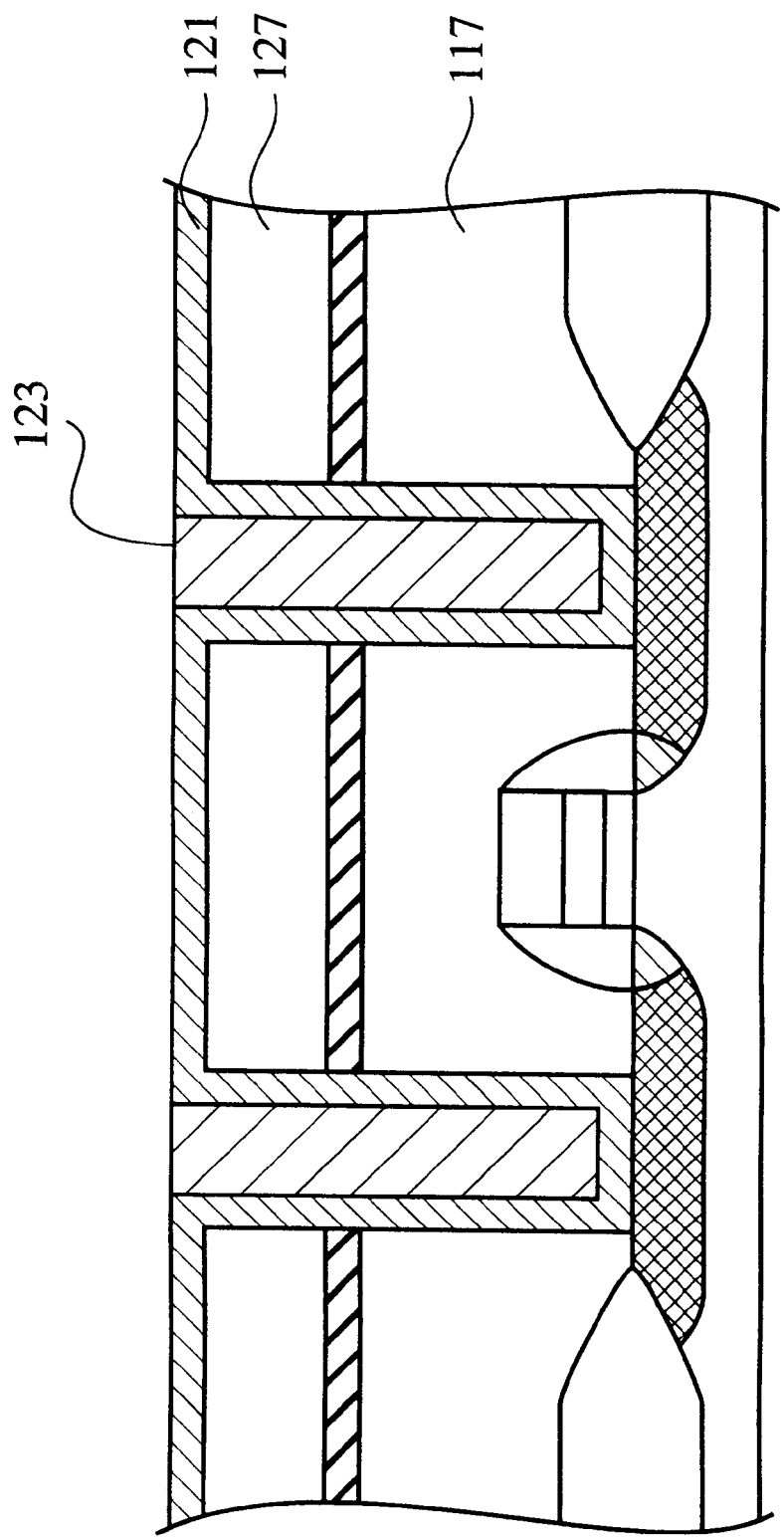

Next, as shown in FIG. 21, the aluminum film 123 is flattened by CMP to expose the barrier metal 21 and form plug electrodes 123. At this time, by a suitable solvent (for example a slurry containing alumina) being selected, the tantalum film 121 used as the barrier metal is made to serve as an etching stopper film. The etching is terminated when the tantalum film 121 on the interlayer insulating film 127 becomes exposed.

Figure 22:
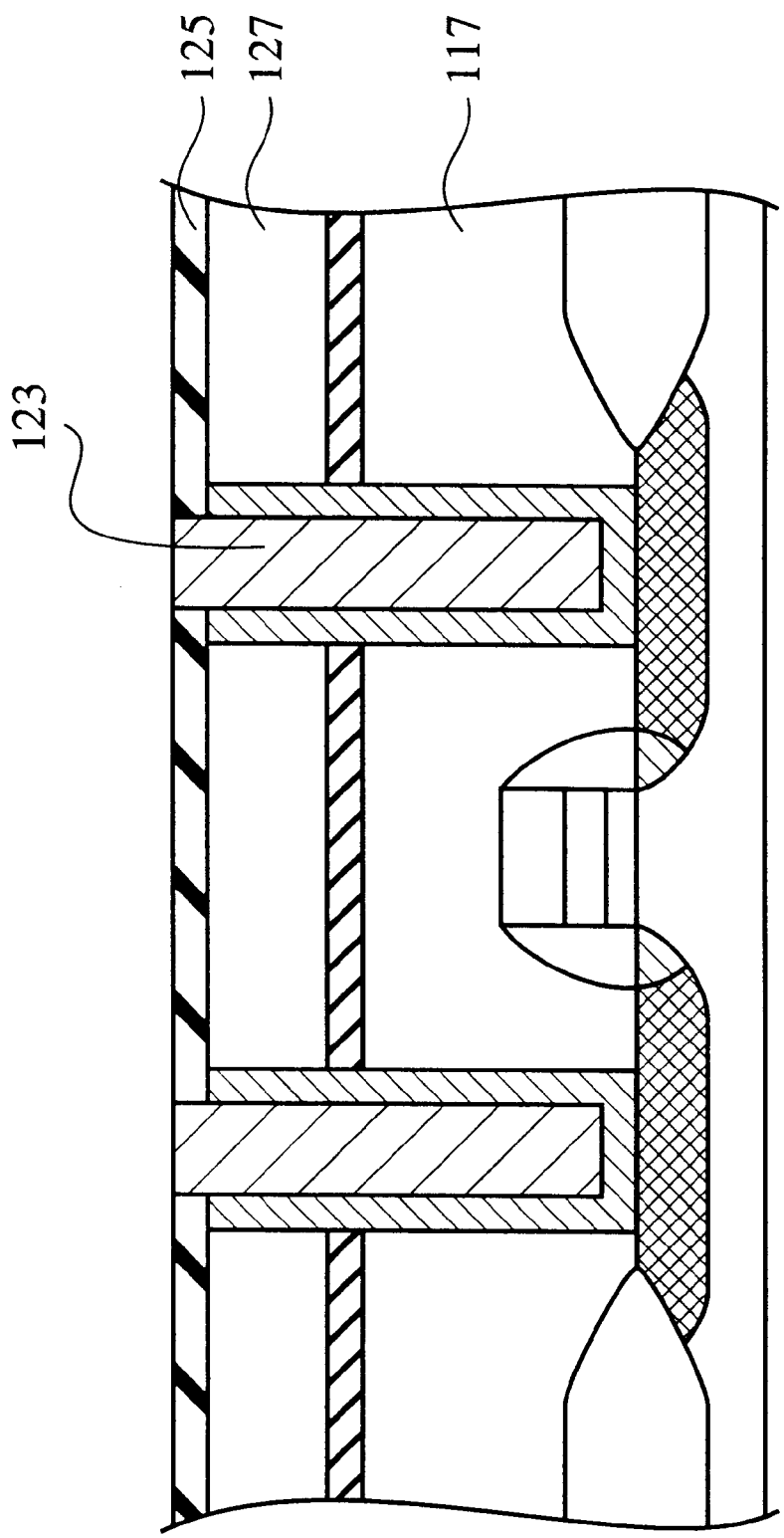

Next, as shown in FIG. 22, the tantalum film left as an etching stopper film on the interlayer insulating film 127 is oxidized with the aluminum film 123 as a mask and thereby transformed into an insulating tantalum oxide film 125. At this time it is necessary to oxidize only the tantalum film on the interlayer insulating film 127, without oxidizing the aluminum film 123 constituting the interconnection metal. As the method of this oxidation, for example oxidation in a hydrogen atmosphere containing steam (besides dilution oxidation, oxidation by radical oxidation and anodic oxidation are also possible) is carried out. This is possible because in the case of aluminum in an oxidizing atmosphere the surface of the aluminum becomes covered with aluminum oxide (alumina) and oxidation does not progress inward. As seen from above the structure is that of a tantalum oxide film 125 having openings only at the plug electrodes 123 formed on an insulating film 17.

Figure 23:
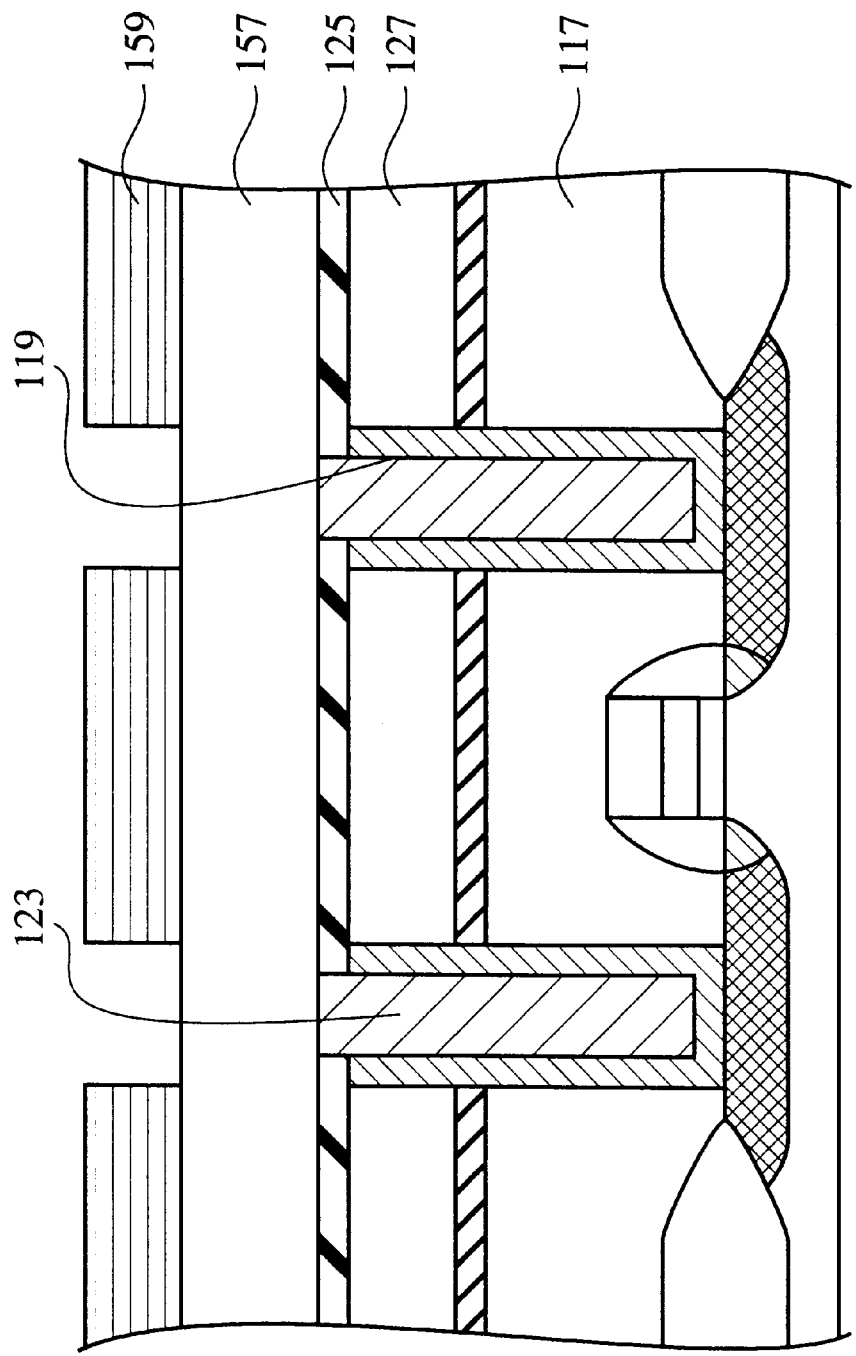

Next, as shown in FIG. 23, a silicon oxide film is formed on the tantalum oxide film 125 and the plug electrodes 123 as an interlayer insulating film 157. Then, a photoresist film 159 having openings above the plug electrodes 123 is formed on the interlayer insulating film 157.

Figure 24:
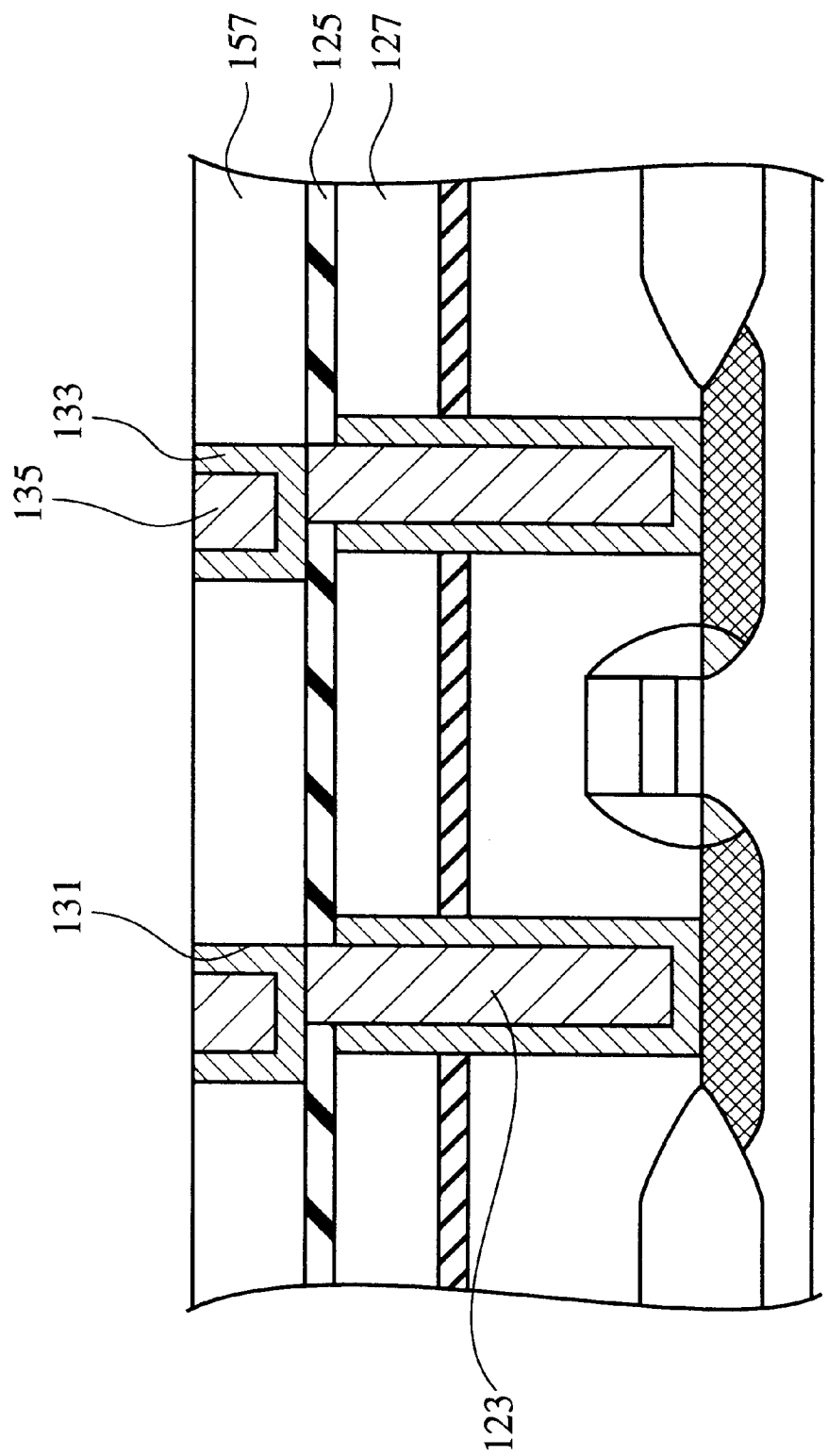

Next, as shown in FIG. 24, with the photoresist film 159 as a mask, the interlayer insulating film 157 is etched to form via holes 131. At this time, in the etching step, even if the positions of the openings in the photoresist film 159 and the plug electrodes 123 are misaligned, because the tantalum oxide film 125 serves as an etching stopper film, the interlayer insulating film 127 is not etched together with the interlayer insulating film 157.

Then a barrier metal 133 and an aluminum film 135 are deposited in the via holes 131. An interconnection layer and a passivation film and so on are then formed to complete the semiconductor device. In an alternative to the second embodiment different metals may be used. For example the barrier metal 119 niobium, and the contact electrodes 123 may be copper. Copper has the advantage of low resistivity.

FIG. 25 through FIG. 35 are sectional views illustrating in sequence a third preferred embodiment of the invention. In this third preferred embodiment, in which the example of a MOS type semiconductor device is again used, plug electrodes electrically continuous with contact electrodes are formed.

Figure 25:
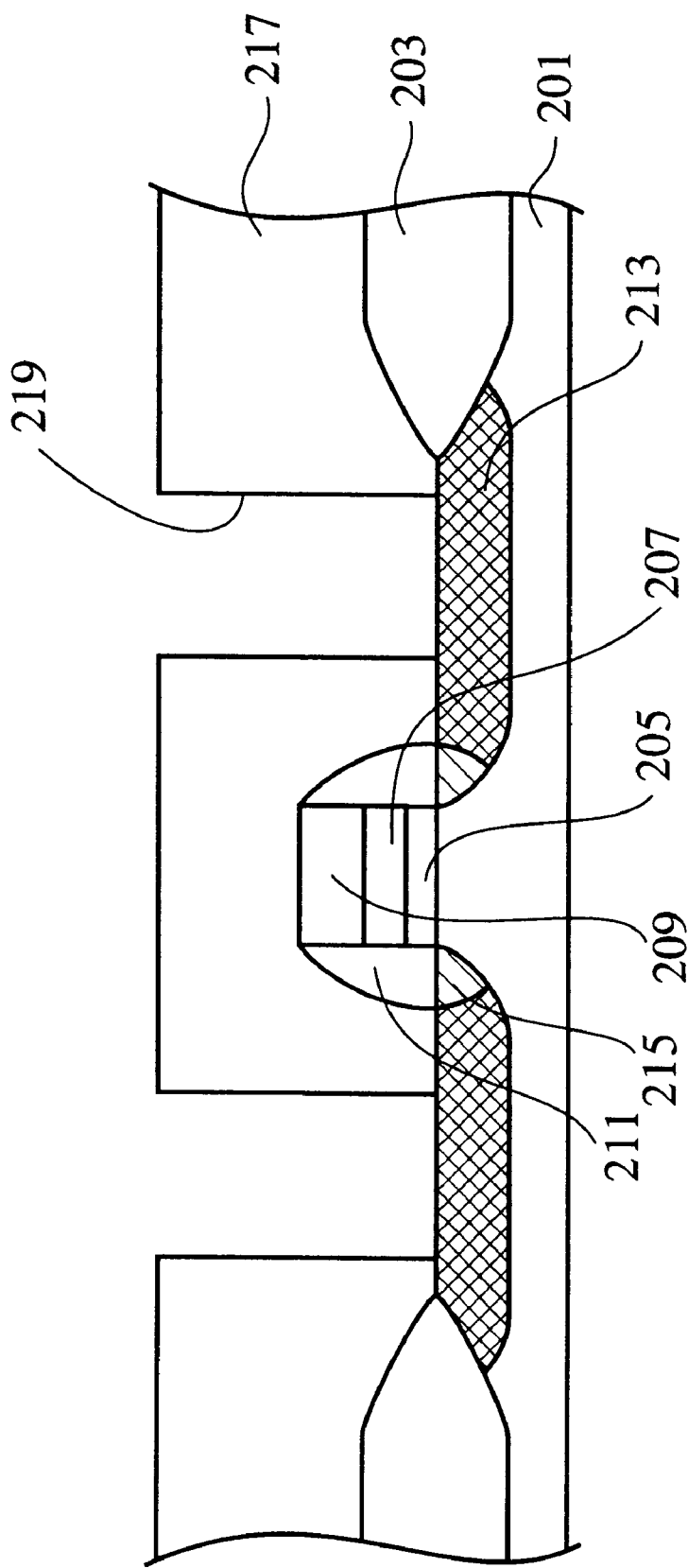
FIG. 25 through FIG. 35 are sectional views illustrating in sequence a process for fabricating a semiconductor device of a third preferred embodiment of the invention.

First, as shown in FIG. 25, a field oxide film 203 is formed on the surface of a semiconductor substrate 201, and on the semiconductor substrate 201 in a device formation region bounded by the field oxide film 203 are successively formed a gate insulating film 205, a polycrystalline silicon film 207 of a lower gate electrode and an aluminum film 209 of an upper electrode. A gate side wall insulating film 211 is then formed on the side walls of the gate electrode by photo-etching. Also, high-concentration source and drain regions 213 and low-concentration source and drain regions 215 are formed in the semiconductor substrate 201 by ion implantation. Next, an interlayer insulating film 217 of for example boron phosphorus silicate glass (BPSG) or phosphorus silicate glass (PSG) is formed on the semiconductor substrate 201, the gate electrode 209 and the device separation region 203 by chemical vapor deposition (CVD), and the interlayer insulating film 217 is flattened by chemical mechanical polishing (CMP). Contact holes 219 are then formed over the high-concentration source and drain regions 213 by photo-etching.

Figure 26:
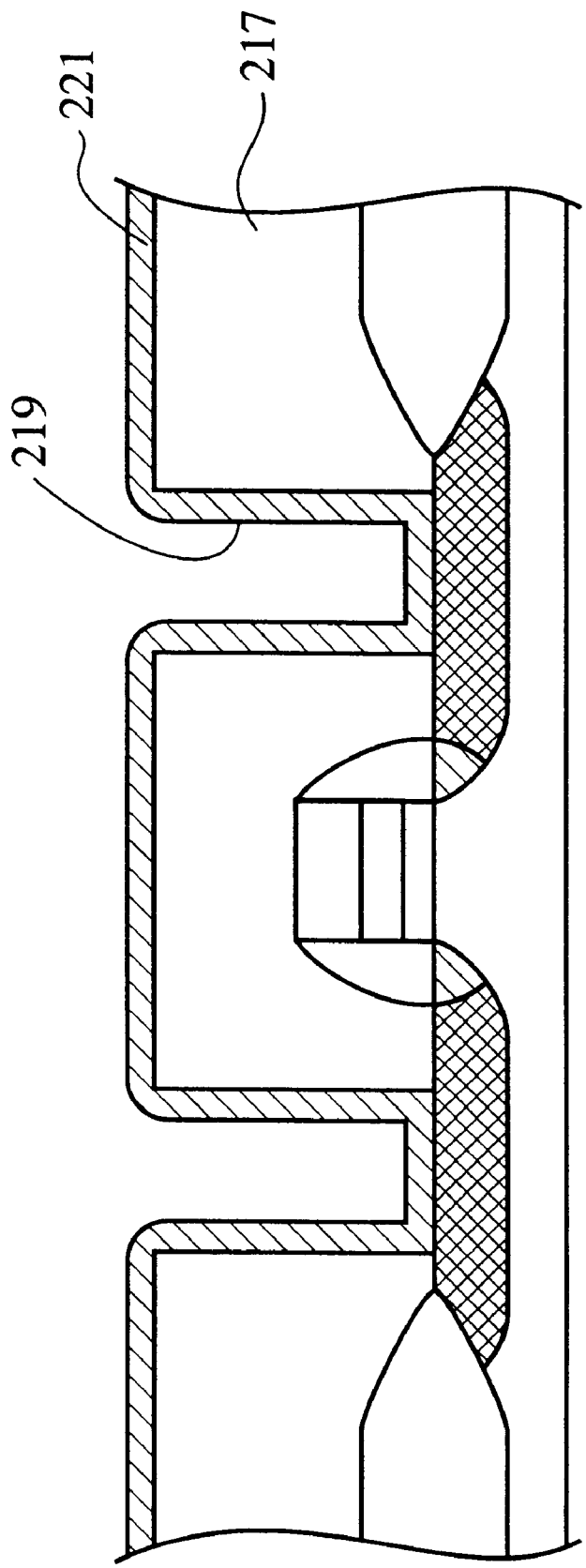

Next, as shown in FIG. 26, a barrier metal 221 consisting of tantalum is formed on the interlayer insulating film 217 and the inner surfaces of the contact holes 219 by sputtering.

Figure 27:
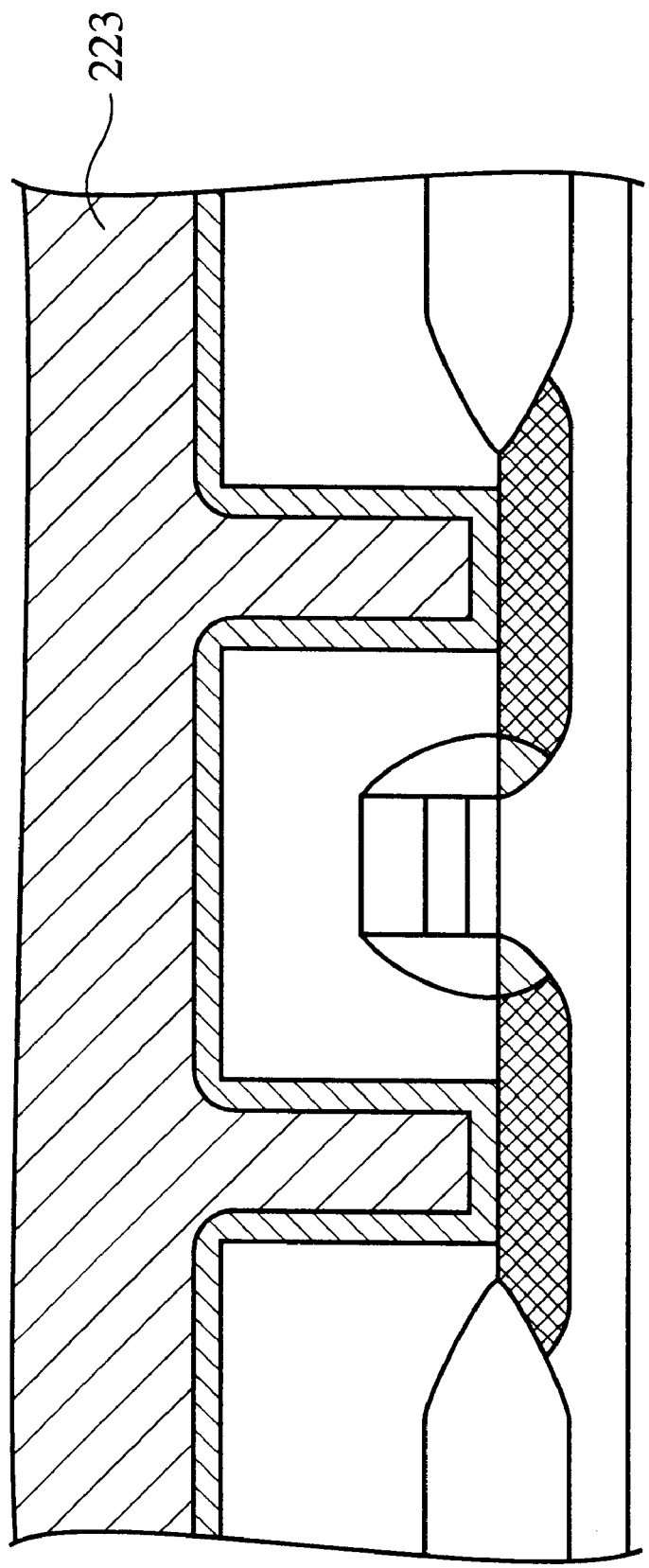

Then, as shown in FIG. 27, an aluminum film 223 to constitute interconnection metal is deposited on the barrier metal 221 by sputtering, and using CVD or the like the, insides of the contact holes 219 are completely filled with aluminum film.

Figure 28:
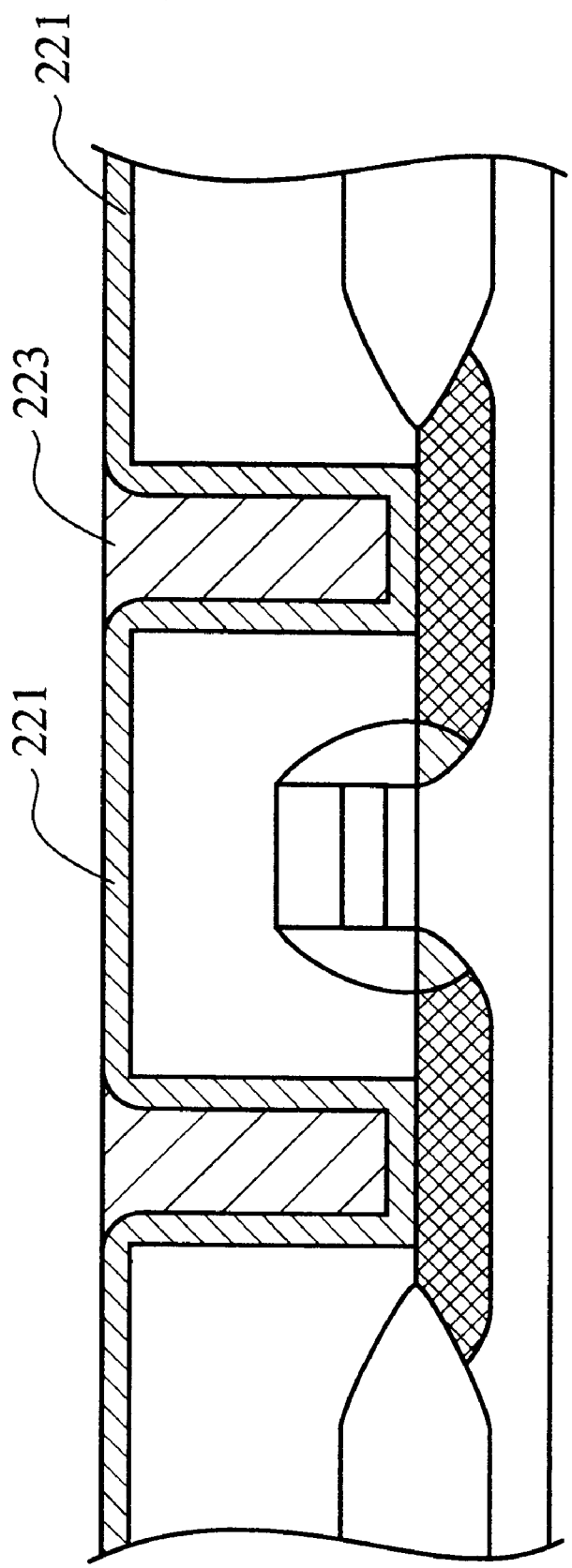

Next, as shown in FIG. 28, the aluminum film 223 is flattened by CMP. At this time, by a suitable solvent (for example a slurry containing alumina) being selected, the tantalum film 221 used as a barrier metal is made to serve as an etching stopper film. The etching is terminated when the tantalum film 221 on the interlayer insulating film 217 becomes exposed, and contact electrodes 223 are thereby formed.

Figure 29:
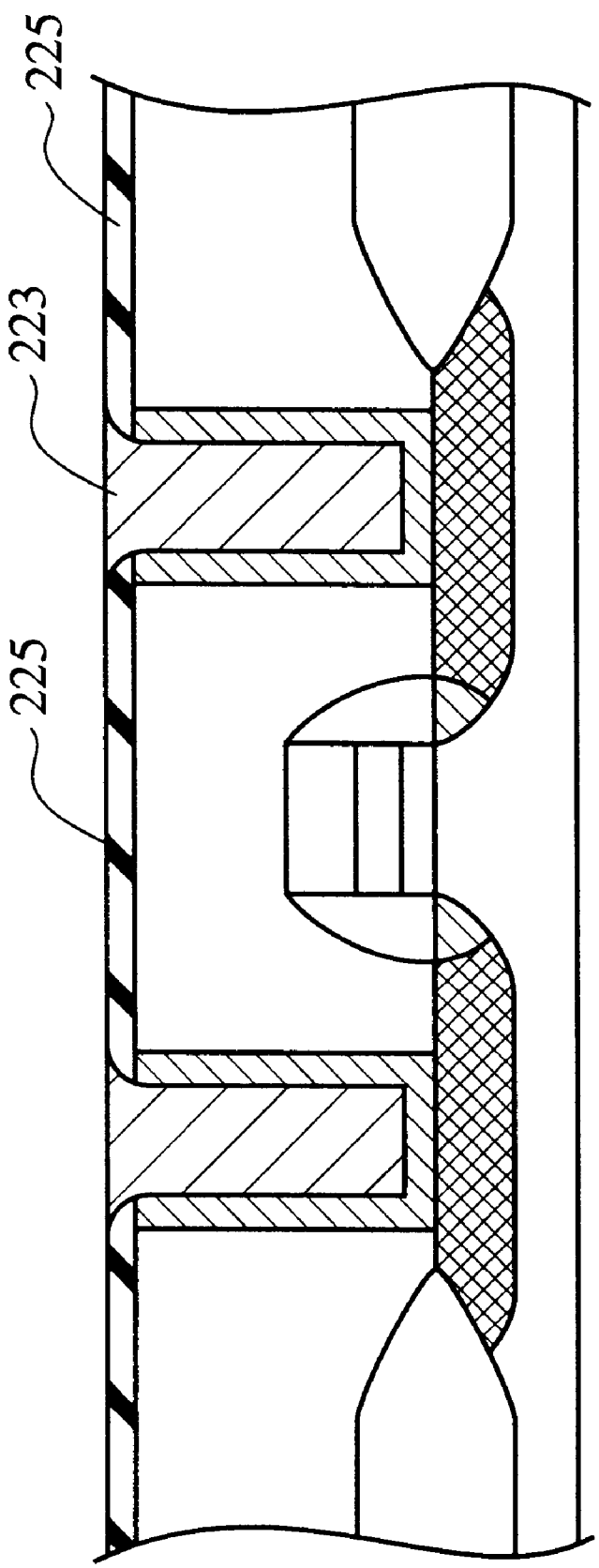

Then, as shown in FIG. 29, with the contact electrodes 223 as masks, the tantalum film on the interlayer insulating film 217 is oxidized and transformed into an insulating tantalum oxide film 225. At this time, it is necessary to oxidize only the tantalum film of the barrier metal, without oxidizing the aluminum film 223 constituting the interconnection metal. As the method of this oxidation, for example it is possible to form the tantalum oxide film 225 without oxidizing the aluminum film 223 by carrying out oxidation in a hydrogen atmosphere containing steam (besides dilution oxidation, oxidation by radical oxidation and anodic oxidation are also possible). This is because in the case of aluminum in an oxidizing atmosphere the surface of the aluminum becomes covered with aluminum oxide (alumina) and oxidation does not progress inward.

Figure 30:
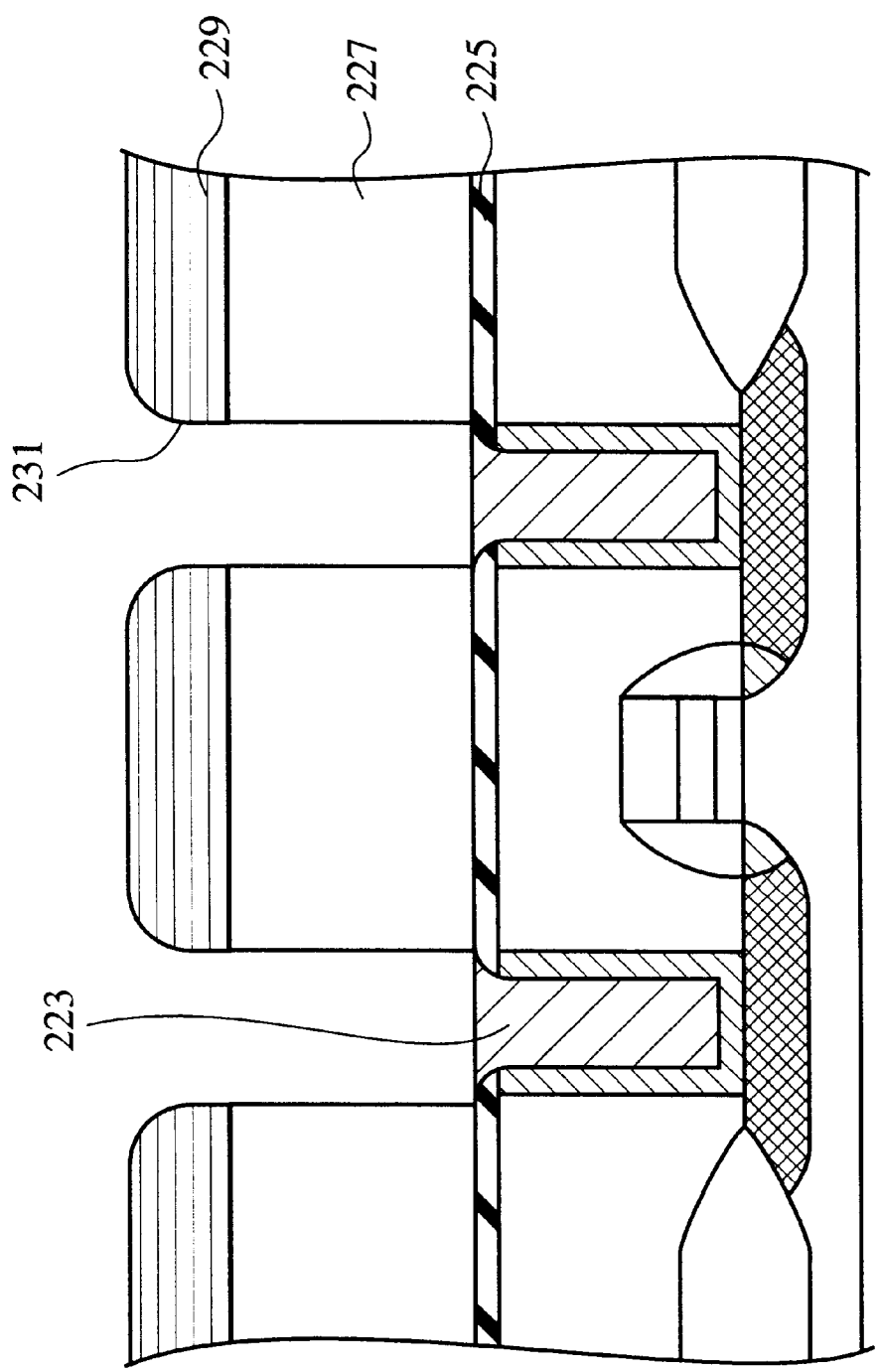

Next, as shown in FIG. 30, a silicon oxide film is formed on the tantalum oxide film 225 and the contact electrodes 223 as an interlayer insulating film 227. Then, a photoresist film 229 having openings over the contact electrodes 223 is formed on the silicon oxide film 227. Then, with the photoresist film 229 as a mask, the interlayer insulating film 227 is etched to expose the contact electrodes 223 and via holes 231 connecting with the aluminum film 223 are thereby formed.

Figure 31:
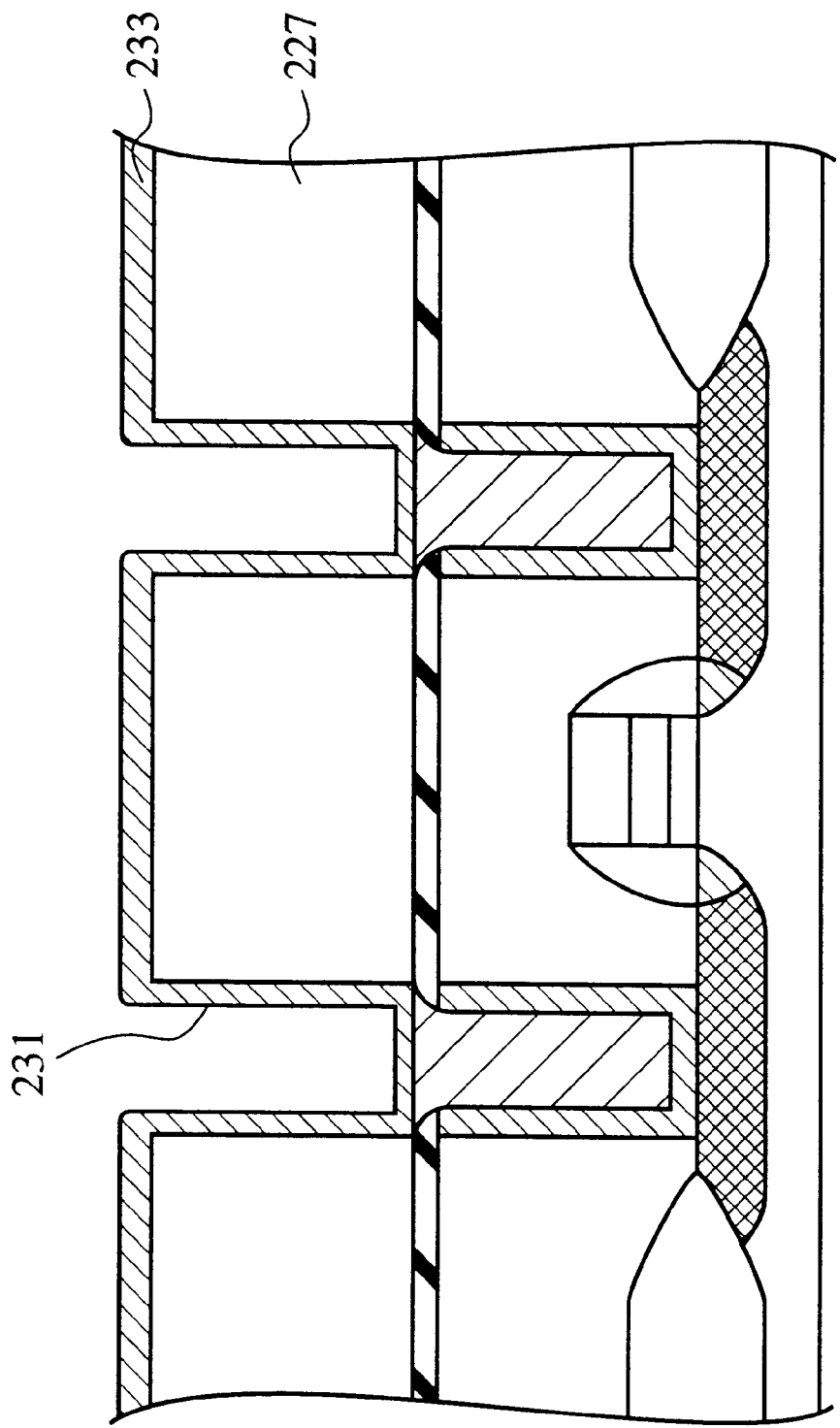

Next, as shown in FIG. 31, a barrier metal 233 consisting of tantalum is formed on the interlayer insulating film 227 and the inner surfaces of the contact holes 231 by sputtering.

Figure 32:
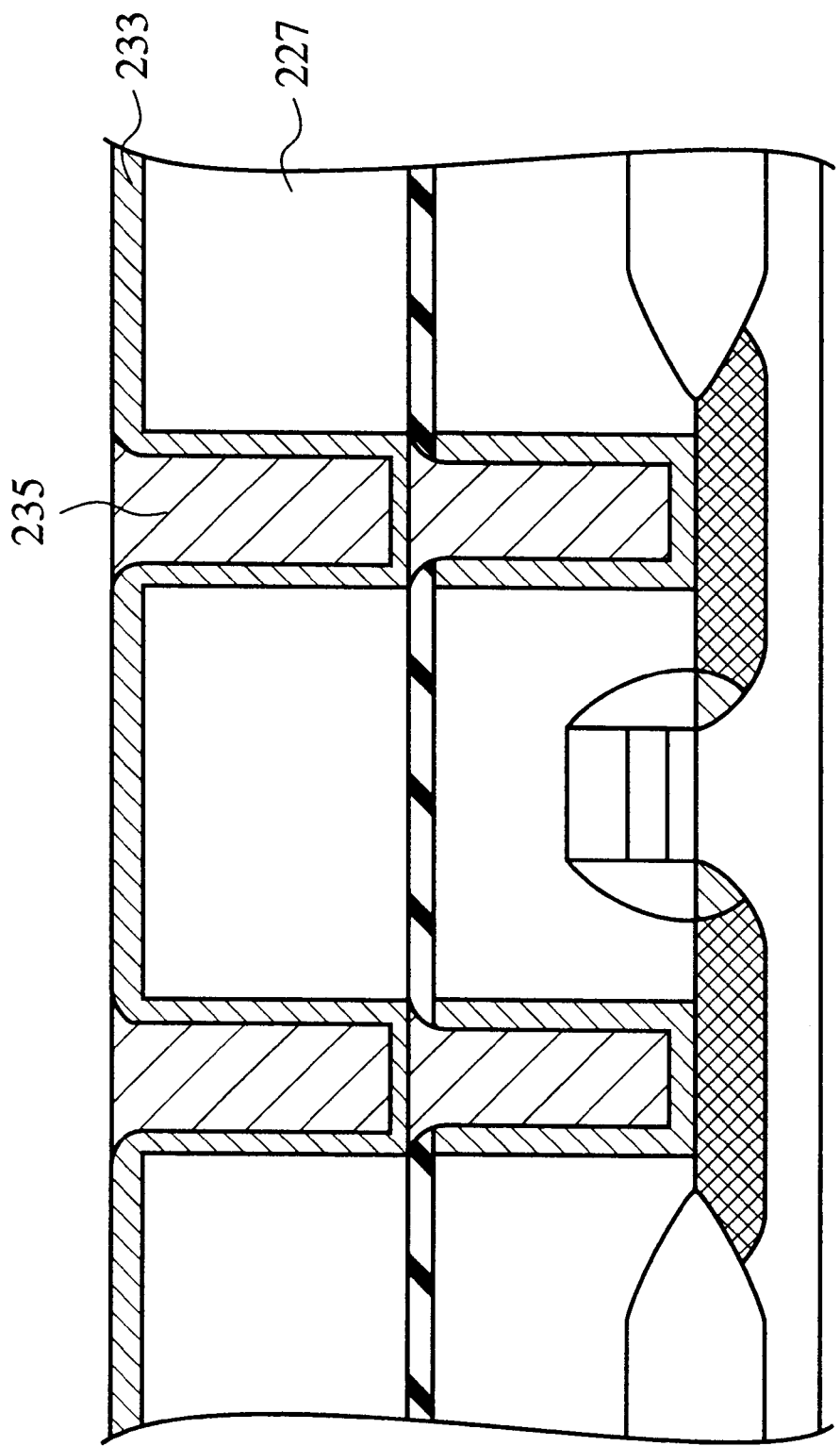

Then, as shown in FIG. 32, an aluminum film 235 to constitute interconnection metal is formed on the barrier metal 233 by CVD or the like so that the insides of the contact holes 231 are completely filled, and the aluminum film 235 is flattened by CMP to form contact electrodes 235. At this time, by a suitable solvent (for example a slurry containing alumina) being selected, the tantalum film used as the barrier metal 233 is made to serve as an etching stopper film. The etching is terminated when the barrier metal 233 on the interlayer insulating film 227 becomes exposed.

Figure 33:
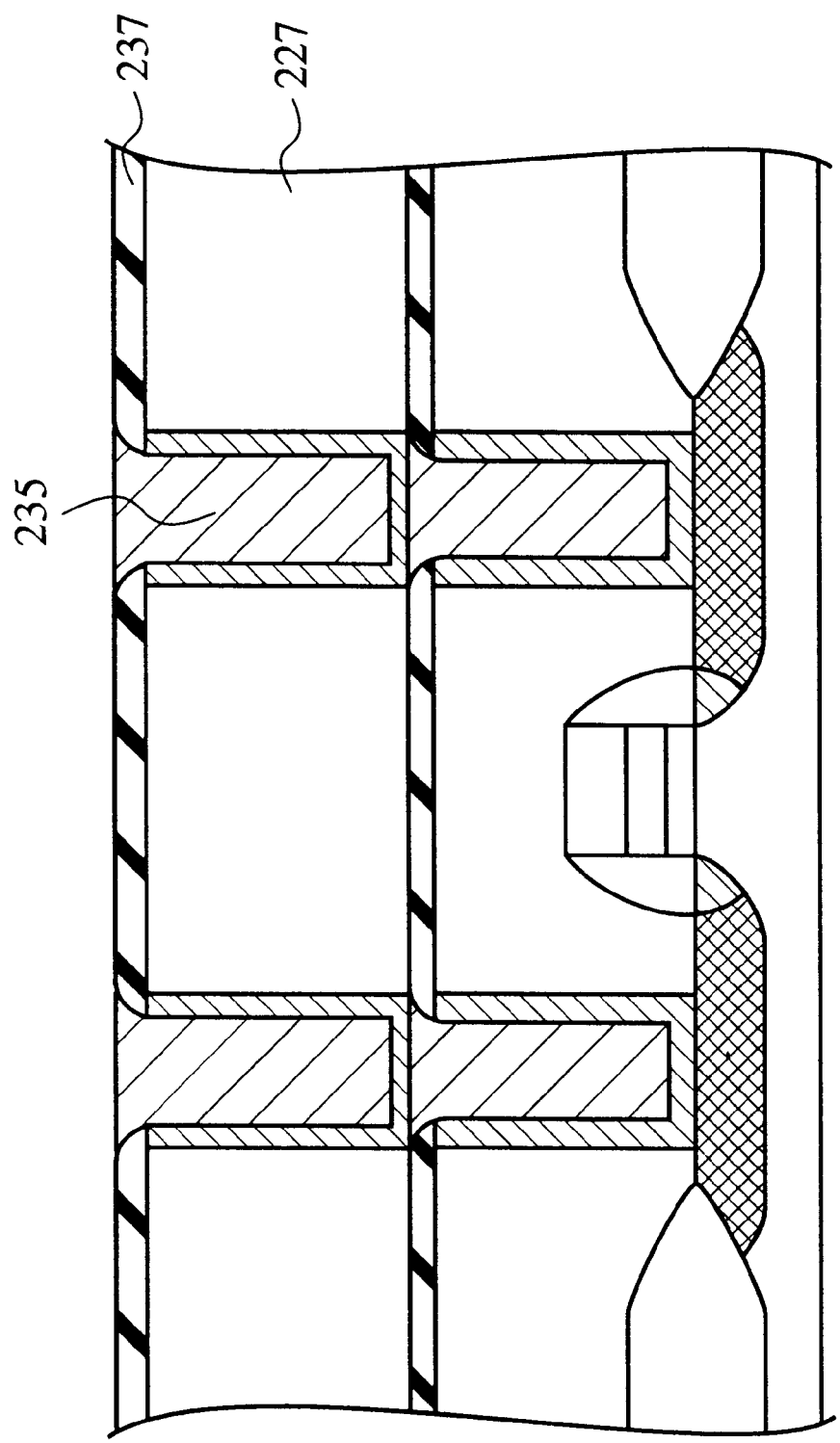

Next, as shown in FIG. 33, the tantalum film on the interlayer insulating film 227 is oxidized with the aluminum film 235 as a mask and thereby transformed into an insulating tantalum oxide film 237. At this time, it is necessary to oxidize only the tantalum film constituting the barrier metal 233, without oxidizing the aluminum of the contact electrode 235. As the oxidation method, for example by carrying out oxidation in a hydrogen atmosphere containing steam (besides dilution oxidation, oxidation by radical oxidation or anodic oxidation are also possible) it is possible to form the tantalum oxide film 237 without oxidizing the aluminum film constituting the contact electrodes 235. This is because in the case of aluminum in an oxidizing atmosphere the aluminum surface becomes covered with aluminum oxide (alumina) and oxidation does not progress inward.

Figure 34:
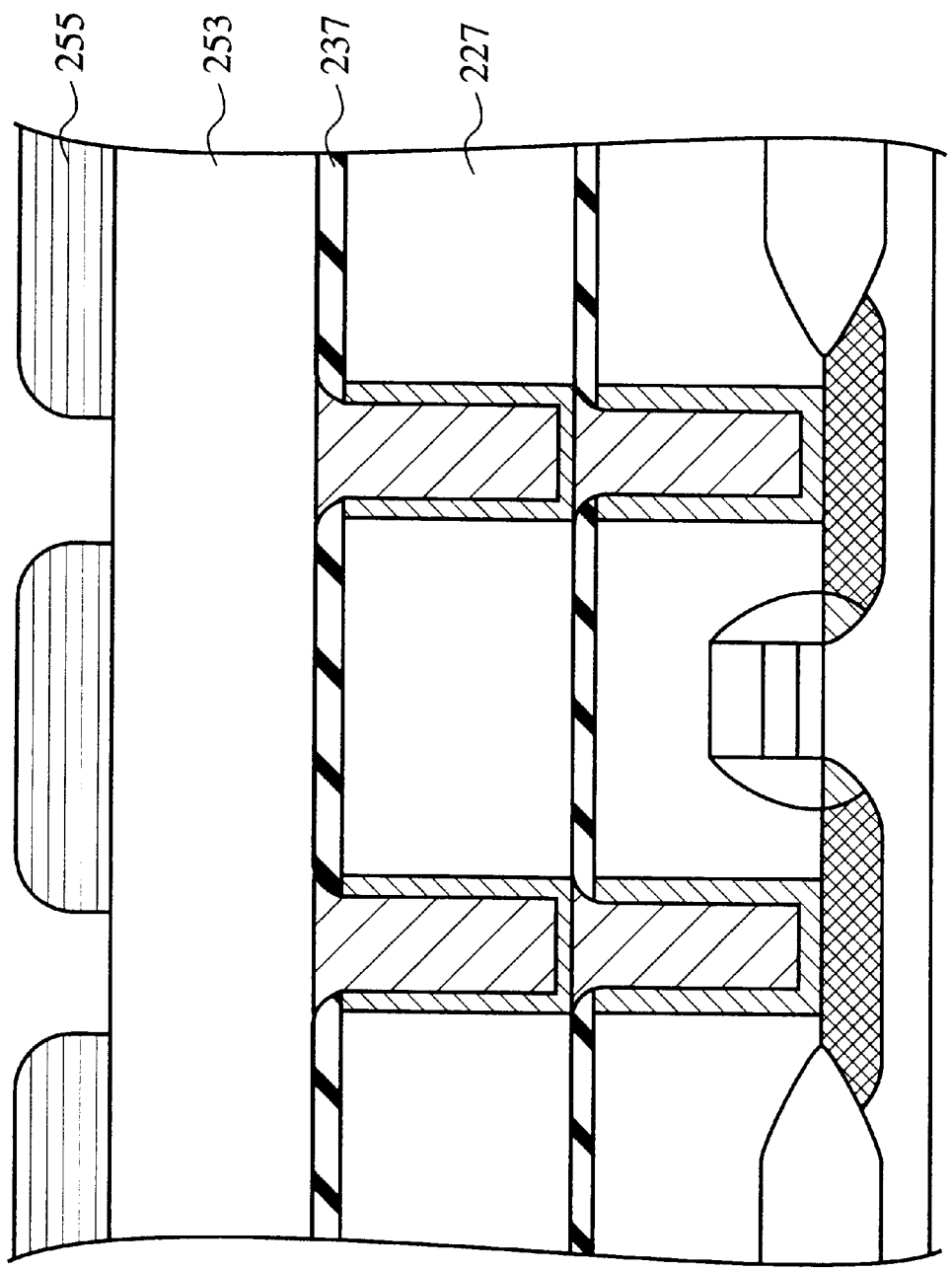

Next, as shown in FIG. 34, a silicon oxide film 253 is formed on the tantalum oxide film 237 and the contact electrodes 235 as an interlayer insulating film 253. Then, a photoresist film 255 having openings over the contact electrodes 235 is formed on the silicon oxide film 253.

Figure 35:
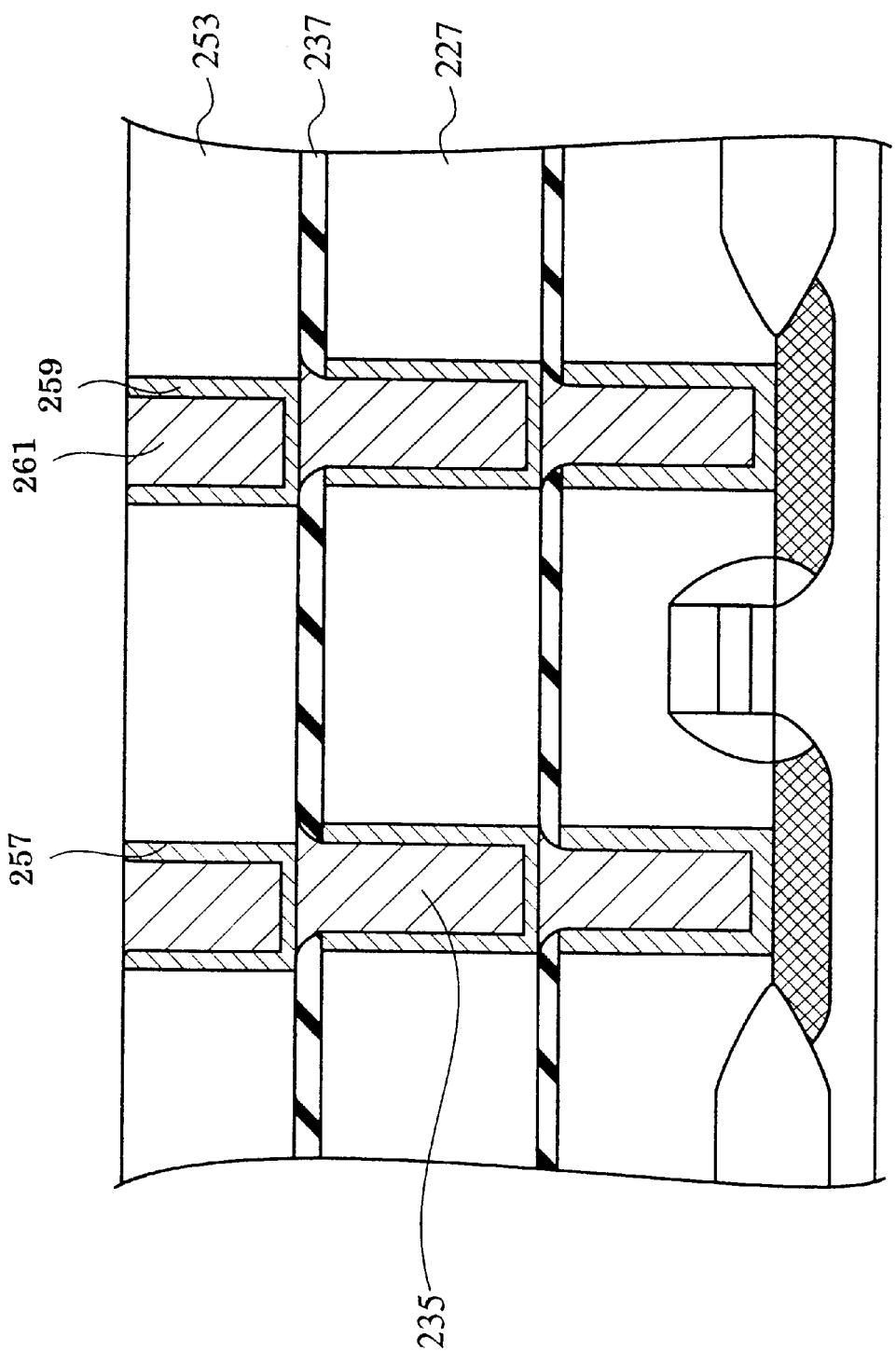

Next, as shown in FIG. 35, with the photoresist film 255 as a mask, the interlayer insulating film 253 and the interlayer insulating film 227 are consecutively etched to expose the contact electrodes 235. At this time, in the etching step, even if the positions of the openings in the photoresist film 255 and the contact electrodes 235 are misaligned, because the tantalum oxide film 251 serves as an etching stopper film, the interlayer insulating film 227 is not etched together with the interlayer insulating film 253.

Then a barrier metal 259 and an aluminum film 261 are deposited in the via holes 257. An interconnection layer and a passivation film and so on are then formed to complete the semiconductor device. In an alternative to the third embodiment different metals may be used. For example the barrier metal 231 niobium, and the contact electrodes 235 may be copper. Copper has the advantage of low resistivity.

Figure 36:
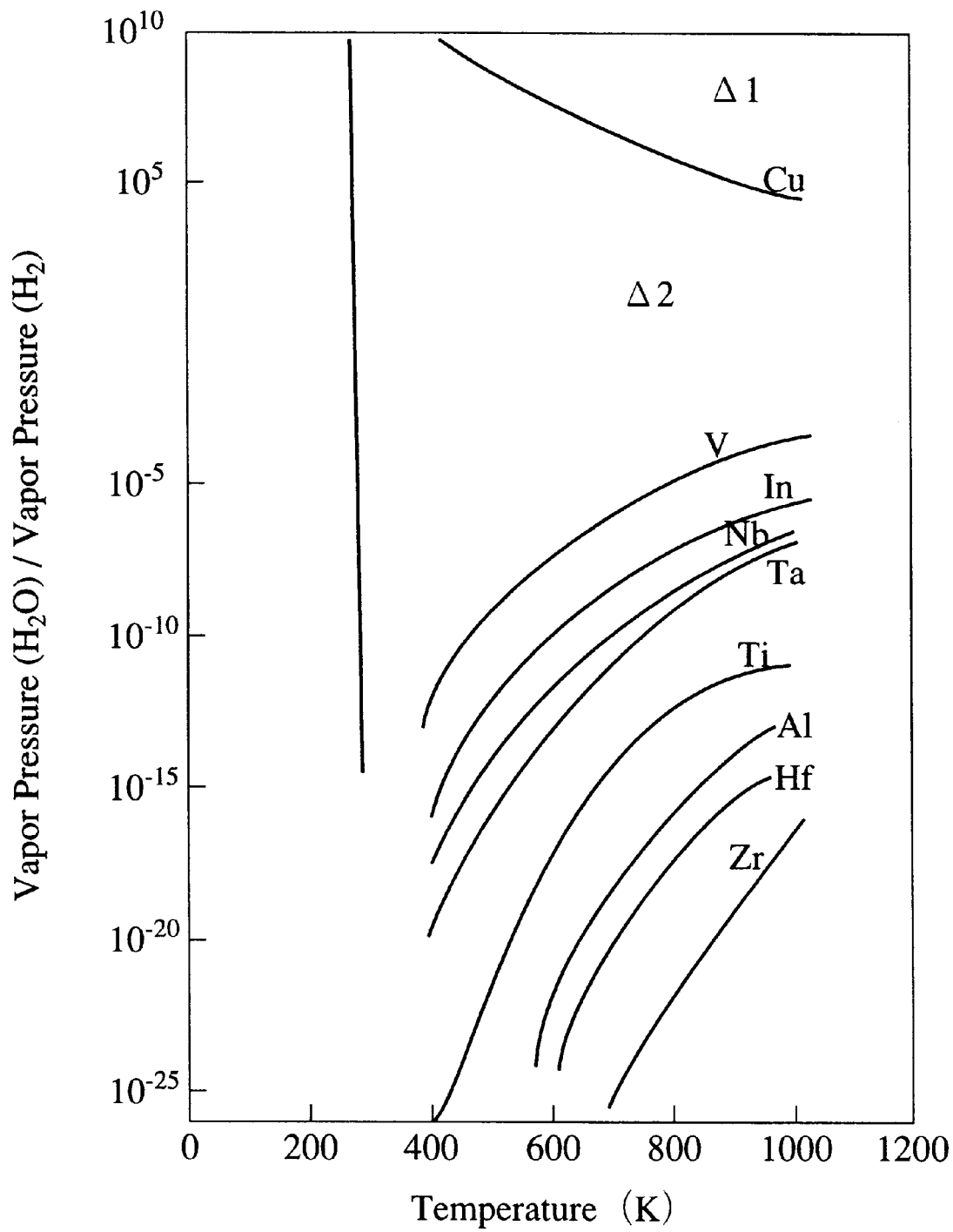
FIG. 36 is a chart showing thermal equilibria of oxidation of aluminum and other metals.

FIG. 36 is a chart showing thermal equilibria of metal oxidation in an atmosphere of a gas mixture of hydrogen and steam, and shows vapor pressure curves under different temperature conditions for Cu (copper), V (vanadium), In (indium), Nb (niobium), Ta (tantalum), Ti (titanium) Al (aluminum), Hf (hafnium) and Zr (zirconium). Using this chart, barrier metal oxidation conditions will now be discussed. The vertical axis shows the vapor pressure ratio of steam to hydrogen of the gas mixture and the horizontal axis shows reaction temperatures in absolute temperature. For example at vapor pressures above the vapor pressure curve of Cu (copper), for example at the lattice point 1 ($\Delta$1), because the proportion of water is high, copper oxidizes. Reversely, at vapor pressures lower than the vapor pressure curve of Cu (copper), for example at the lattice point 2 ($\Delta$2), copper does not oxidize. Similarly, looking at the vapor pressure curve for Ta (tantalum), at vapor pressures above the vapor pressure curve of tantalum, for example at the lattice point 2 ($\Delta$2), tantalum oxidizes, and at vapor pressures below the tantalum curve, tantalum does not oxidize. Now, because when aluminum is in an oxidizing atmosphere an aluminum oxide film (alumina) forms covering the surface of the aluminum and prevents oxidation from progressing inward, aluminum does not readily oxidize irrespective of the vapor pressure curve data. As conditions in which only tantalum oxidizes, and aluminum does not oxidize, of the kind shown in the present invention, oxidation in an atmosphere in the region above the equilibrium curve of Ta (tantalum), for example in the region in which the lattice point 2 ($\Delta$2) lies, whose temperature is about 400 to 800K and of which the ratio of the vapor pressure of steam to the vapor pressure of hydrogen is above about 1:10E-1 is preferable. When copper is used for the interconnections, oxidation in an atmosphere whose temperature is about 400 to 800K and of which the ratio of the vapor pressure of steam to the vapor pressure of hydrogen is above about 1:10E-1 and below about 105 is preferable.

Figure 37:
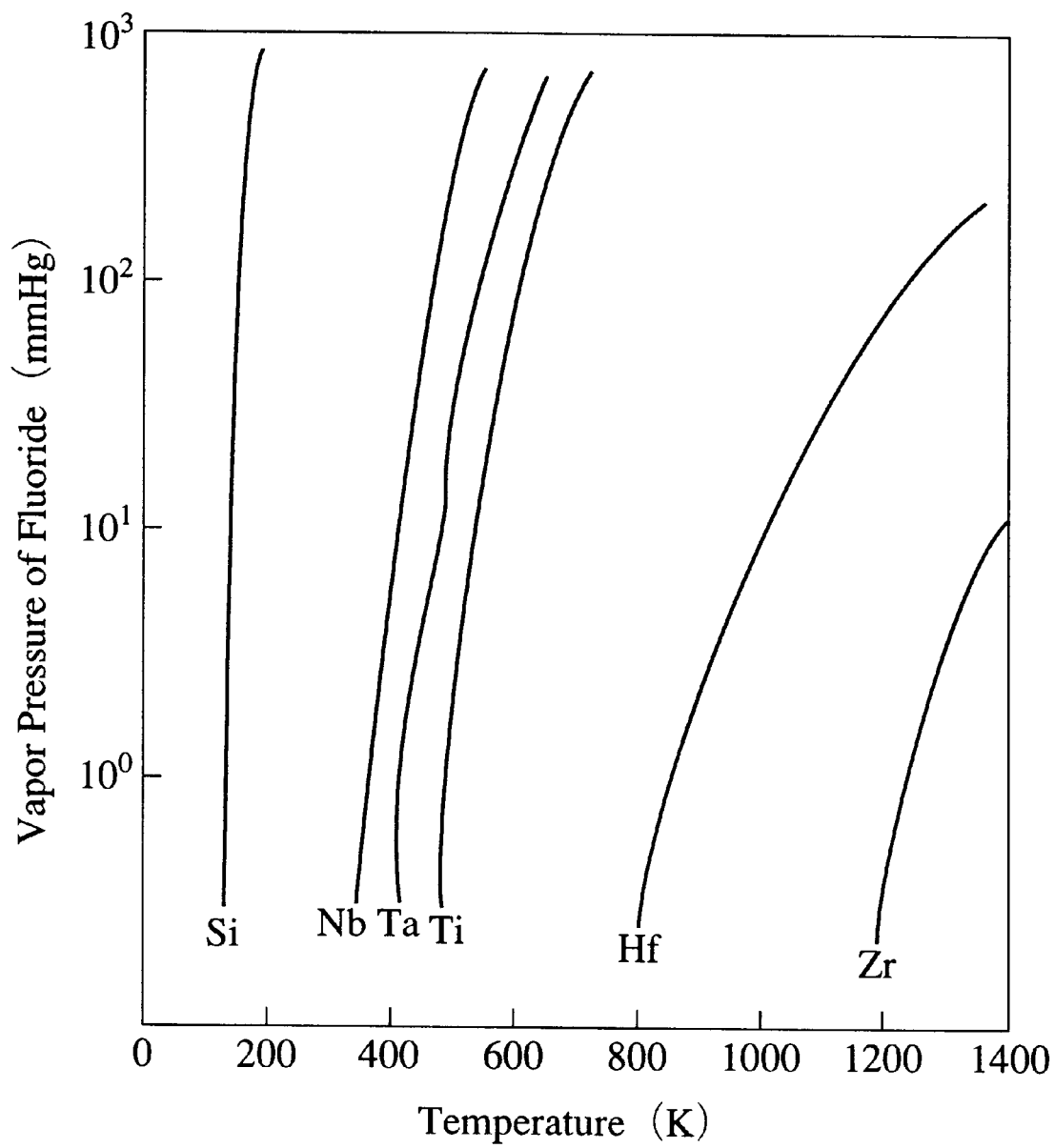
FIG. 37 is a chart showing vapor pressure curves of silicon and a number of metals.
Figure 38:
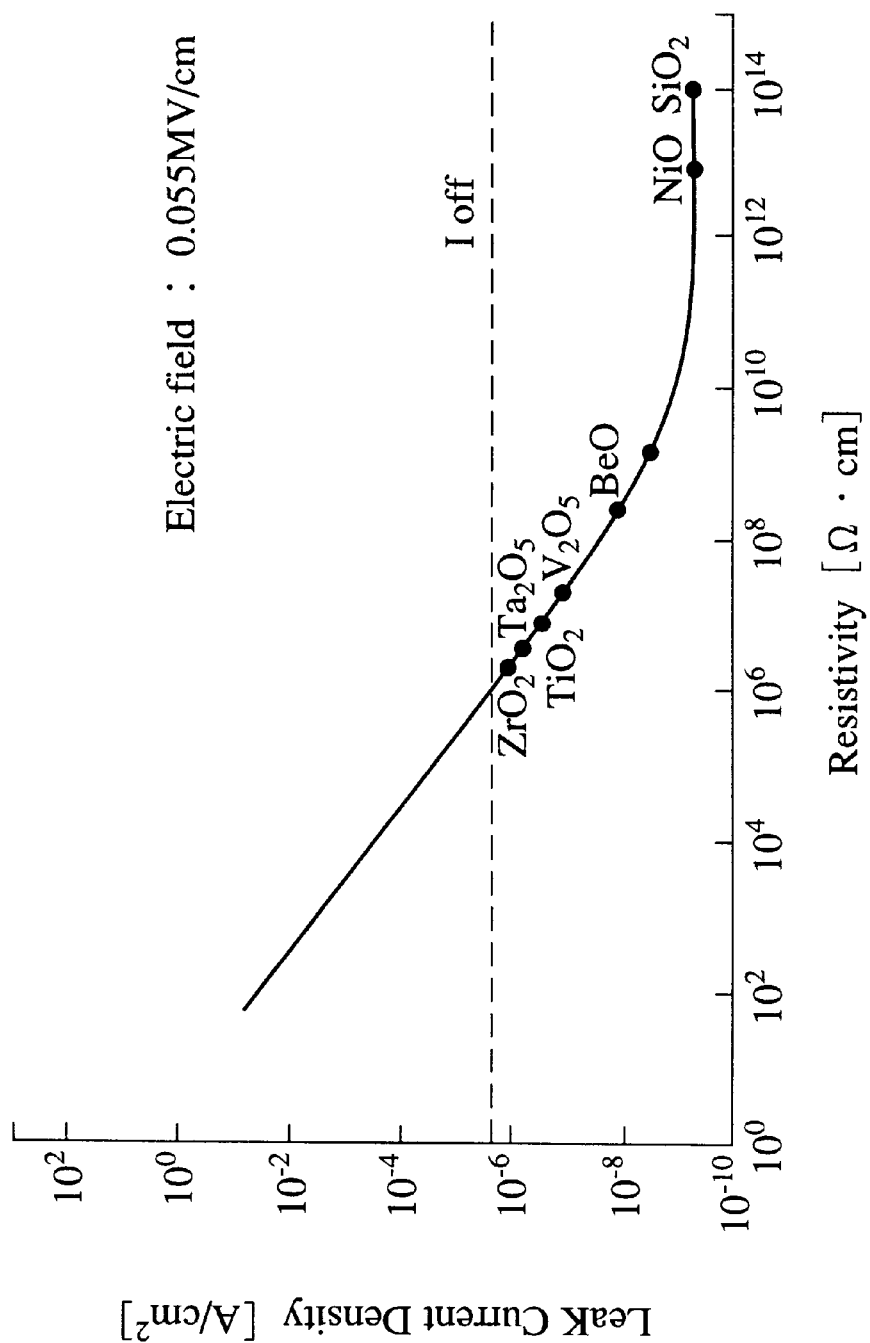
FIG. 38 is a chart showing resistivities of various metal materials.

FIG. 37 is a chart showing thermal equilibria of silicon and tantalum in a gas consisting of fluorides, and shows vapor pressure curves under different temperature conditions for Si (silicon), Nb (niobium), Ta (tantalum), Ti (titanium), Al (aluminum), Hf (hafnium) and Zr (zirconium). On the basis of this chart, the grounds for tantalum oxide serving as an etching stopper film will now be discussed. In the vapor pressure region above its vapor pressure curve a metal will vaporize, and in the vapor pressure region below its vapor pressure curve a metal will solidify. In roughly the temperature range at which etching is carried out (from 600K), it can be seen that compared to the vapor pressure of fluorides of silicon (Si), the vapor pressure of fluorides of niobium (Nb) is very low. In other words, under the same temperature conditions in fluorine gas, silicon vaporizes more easily than tantalum. From this it can be seen that silicon oxide, comprising silicon, is etched by a gas of fluorides, whereas tantalum oxide, comprising tantalum, is not etched. The property of a material to be etched under a given set of conditions may be referred to as a etching selection ratio. As shown in FIG. 37, for example, silicon has a different etching ratio than tantalum, and niobium has a same feature FIG. 38 is a chart showing a relationship between oxide film materials and transistor leak current, and on the basis of this chart the insulativity of oxidized barrier metals will now be discussed. The measurements are leak current densities of different oxide film materials at below 200° C. with an electric field of 0.555 MV/cm impressed. Normally, it is considered that leak current does not flow if the leak current density is below about 10E-6(A/cm2). Therefore it can be seen from FIG. 38 that as oxide film materials, oxides of zirconium (Zr), tantalum (Ta), titanium (Ti) and silicon (Si) are regarded as producing no leak current.

The invention is not limited to the first through third preferred embodiments described above. For example, although in the first and second preferred embodiments tantalum was used as the barrier metal, besides tantalum the barrier metal may be made of transition metals and their alloys and compounds having the property that the metal solid is a good conductor and the oxide is a poor conductor (insulation between contact electrodes is possible if the resistivity of the oxide is over 1K $\Omega \cdot$m).

The interconnection metal also is not limited to aluminum, and it also is possible to use copper. In this case Nb is used as the barrier metal. This is because since niobium has no reactivity with copper and the solid solution limit in niobium is very small there is no diffusion of copper into its crystals.

The invention is not limited to application to field effect transistors and can be applied to bipolar transistors and other devices, and the semiconductor substrate also may alternatively be an SOI substrate consisting of a silicon film formed on a silicon oxide film.

While there have been illustrated and described what are presently considered to be preferred embodiments of the present invention, it will be understood by those skilled in the art that various changes and modifications may be made, and equivalents may be substituted for devices thereof without departing from the true scope of the invention. In addition many modifications may be made to adapt a particular situation or material to the teaching of the present invention without departing from the central scope thereof. Therefore, it is intended that this invention not be limited to the particular embodiments disclosed as the best modes contemplated for carrying out this invention, but that the invention include all embodiments falling within the scope of the appended claims.

What is claimed is:

1. A process for fabricating a semiconductor device comprising the steps of:

forming an impurity region at the surface of a semiconductor substrate;

forming a first insulating layer on the semiconductor substrate;

forming a first hole in the first insulating layer and thereby exposing the impurity region;

forming a first metal layer on the first insulating layer and the inner surface of the first hole;

forming a second metal layer on the region of the first metal layer on the inner surface of the first hole and filling the first hole with the second metal layer;

oxidizing the first metal layer with the second metal layer as a mask;

forming a second insulating layer on the first metal layer and the second metal layer;

etching a second hole in the second insulating layer using the first oxidized metal layer and the second metal layer as etching stoppers; and filling the second hole with a metal and thereby forming a third metal layer.

2. A process for fabricating a semiconductor device according to claim 1, wherein the oxidation of the first metal layer is oxidation in an atmosphere of a gas mixture of steam and hydrogen.

3. A process for fabricating a semiconductor device according to claim 1, wherein the second metal layer covers only the region of the first metal layer on the inner surface of the first hole.

4. A process for fabricating a semiconductor device according to claim 1, wherein the step of oxidizing the first metal layer is a step of oxidizing the first metal layer only, without substantially oxidizing the second metal layer.

5. A process for fabricating a semiconductor device according to claim 1, wherein the first metal layer formed on the inner surface of the first hole is a barrier metal.

6. A process for fabricating a semiconductor device according to claim 1, wherein the second insulating layer is a silicon dioxide layer.

7. A process for fabricating a semiconductor device according to claim 1, wherein the resistivity of the oxide of the metal constituting the first metal layer is substantially at least 1K $\Omega \cdot$m.

8. A process for fabricating a semiconductor device according to claim 1, wherein the second metal layer is an interconnection layer and is electrically continuous with the impurity region in the semiconductor substrate.

9. A process for fabricating a semiconductor device according to claim 1, wherein the first insulating layer and the second insulating layer are layers of equal material quality.

10. A process for fabricating a semiconductor device according to claim 1, wherein the metal constituting the first metal layer is tantalum and the metal constituting the second metal layer is aluminum.

11. A process for fabricating a semiconductor device according to claim 10, wherein the oxidation of the first metal layer is oxidation in a gas mixture of steam and hydrogen at a temperature in the range of 400K to 800K.

12. A process for fabricating a semiconductor device according to claim 1, wherein the metal constituting the first metal layer is niobium and the metal constituting the second metal layer is copper.

13. A process for fabricating a semiconductor device according to claim 12, wherein the oxidation of the first metal layer is oxidation in a gas mixture whose temperature is in the range of 400K to 800K and of which the ratio of the vapor pressure of steam to the vapor pressure of hydrogen is in the range of 10E-15 to 10E5.

14. A process for fabricating a semiconductor device comprising the steps of:

forming a conducting layer on a semiconductor substrate;

forming a first insulating layer on the conducting layer;

forming a first hole in the first insulating layer and thereby exposing the conducting layer;

forming a first metal layer on the first insulating layer and the inner surface of the first hole;

forming a second metal layer on the region of the first metal layer formed on the inner surface of the first hole and thereby filling the inside of the first hole;

oxidizing the first metal layer with the second metal layer as a mask;

forming a second insulating layer on the first metal layer and the second metal layer;

etching a second hole in the second insulating layer with the first oxidized metal layer and the second metal layer as etching stoppers; and filling the second hole with a metal and thereby forming a third metal layer.

15. A process for fabricating a semiconductor device according to claim 14, wherein the oxidation is oxidation in an atmosphere of a gas mixture of steam and hydrogen.

16. A process for fabricating a semiconductor device according to claim 14, wherein the second metal layer covers only the first metal layer formed on the inner surface of the first hole.

17. A process for fabricating a semiconductor device according to claim 14, wherein the step of oxidizing the first metal layer is a step of oxidizing a first region of the first metal layer only, without substantially oxidizing the second metal layer.

18. A process for fabricating a semiconductor device according to claim 14, wherein the first metal layer is a barrier metal.

19. A process for fabricating a semiconductor device according to claim 14, wherein the resistivity of the oxide of the metal constituting the first metal layer is at least 1K $\Omega \cdot$m.

20. A process for fabricating a semiconductor device according to claim 14, wherein the second metal layer is an interconnection layer.

21. A process for fabricating a semiconductor device according to claim 14, wherein the second metal layer is electrically continuous with the conducting layer.

22. A process for fabricating a semiconductor device according to claim 14, wherein the second insulating layer is a silicon dioxide layer.

23. A process for fabricating a semiconductor device according to claim 14, wherein the first insulating layer and the second insulating layer are layers having equal material quality.

24. A process for fabricating a semiconductor device according to claim 14, wherein the metal constituting the first metal layer is tantalum and the metal constituting the second metal layer is aluminum.

25. A process for fabricating a semiconductor device according to claim 24, wherein the oxidation of the first metal layer is oxidation in a gas mixture of steam and hydrogen at a temperature in the range of 400K to 800K.

26. A process for fabricating a semiconductor device according to claim 14, wherein the metal constituting the first metal layer is niobium and the metal constituting the second metal layer is copper.

27. A process for fabricating a semiconductor device according to claim 26, wherein the oxidation of the first metal layer is oxidation in a gas mixture whose temperature is in the range of 400K to 800K and of which the ratio of the vapor pressure of steam to the vapor pressure of hydrogen is in the range of 10E-15 to 10E5.

28. A process for fabricating a semiconductor device having a contact plug connecting a part of a first conducting layer to a part of a second conducting layer provided above the part of the first conductive layer with an interlayer insulating film interposed, the process comprising the steps of:

forming a first conducting layer on a semiconductor substrate;

forming a first insulating layer on the first conducting layer;

forming a first hole in the first insulating layer and thereby exposing the first conducting layer;

forming a first metal layer on the first insulating layer and the inner surface of the first hole;

forming a second metal layer on the region of the first metal layer formed on the inner surface of the first hole and thereby filling the inside of the first hole;

oxidizing the first metal layer with the second metal layer as a mask;

forming a second insulating layer on the first metal layer and the second metal layer;

etching a second hole in the second insulating layer with the first metal layer and the second metal layer as etching stoppers; and filling the second hole with a metal and thereby forming a second conducting layer.

29. A process for fabricating a semiconductor device according to claim 28, wherein the oxidation is oxidation in an atmosphere of a gas mixture of steam and hydrogen.

30. A process for fabricating a semiconductor device according to claim 28, wherein the second metal layer covers only the region of the first metal layer formed on the inner surface of the first hole.

31. A process for fabricating a semiconductor device according to claim 28, wherein the step of oxidizing the first metal layer is a step of oxidizing the first metal layer only, without substantially oxidizing the second metal layer.

32. A process for fabricating a semiconductor device according to claim 28, wherein the first metal layer is a barrier metal.

33. A process for fabricating a semiconductor device according to claim 28, wherein the resistivity of the oxide of the metal constituting the first metal layer is at least $1K\Omega\cdot m$.

34. A process for fabricating a semiconductor device according to claim 28, wherein the second metal layer is an interconnection layer or an electrode layer.

35. A process for fabricating a semiconductor device according to claim 28, wherein the second metal layer is electrically continuous with the first conducting layer and the second conducting layer.

36. A process for fabricating a semiconductor device according to claim 28, wherein the second insulating layer is a silicon dioxide layer.

37. A process for fabricating a semiconductor device according to claim 28, wherein the first insulating layer and the second insulating layer are insulating layers having equal properties.

38. A process for making a semiconductor device comprising the steps of:

depositing a metal layer; oxidizing at least a portion of the metal layer;

depositing a first layer on the portion of the metal layer; and etching the first layer wherein the oxidized the portion of the metal layer is an etching stopper.

39. A process for making a semiconductor device according to claim 38, wherein the metal layer is a barrier metal.

* * * * *